United States Patent
Sun et al.

(10) Patent No.: US 11,800,807 B2
(45) Date of Patent: Oct. 24, 2023

(54) HIGH-POWER-DENSITY PIEZOELECTRIC ENERGY HARVESTING SYSTEM

(71) Applicant: The Regents of the University of California, Oakland, CA (US)

(72) Inventors: Jian-Qiao Sun, Merced, CA (US); Cheng Chen, Irvine, CA (US); Amir Sharafi, Merced, CA (US); Tian-Bing Xu, Chesapeake, VA (US); Atousa Yazdani, Davis, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 380 days.

(21) Appl. No.: 17/264,686

(22) PCT Filed: Jul. 31, 2019

(86) PCT No.: PCT/US2019/044549
§ 371 (c)(1),
(2) Date: Jan. 29, 2021

(87) PCT Pub. No.: WO2020/028592
PCT Pub. Date: Feb. 6, 2020

(65) Prior Publication Data
US 2021/0305488 A1    Sep. 30, 2021

Related U.S. Application Data

(60) Provisional application No. 62/854,832, filed on May 30, 2019, provisional application No. 62/712,877, filed on Jul. 31, 2018.

(51) Int. Cl.
*H01L 41/113* (2006.01)
*H10N 30/30* (2023.01)
(Continued)

(52) U.S. Cl.
CPC .......... *H10N 30/306* (2023.02); *H02N 2/181* (2013.01); *H10N 30/802* (2023.02)

(58) Field of Classification Search
CPC .... H10N 30/30; H10N 30/302; H10N 30/304; H10N 30/306; H10N 30/308;
(Continued)

(56) References Cited

U.S. PATENT DOCUMENTS

| 6,927,528 B2 | 8/2005 | Barillot et al. | |
|---|---|---|---|
| 2005/0206275 A1* | 9/2005 | Radziemski | H10N 30/8548 310/339 |

(Continued)

FOREIGN PATENT DOCUMENTS

| KR | 20150066170 A | 6/2015 |
|---|---|---|
| WO | WO-2017149289 A1 | 9/2017 |

OTHER PUBLICATIONS

International Application Serial No. PCT/US2019/044549, International Preliminary Report on Patentability dated Oct. 12, 2020, 10 pgs.

(Continued)

*Primary Examiner* — Derek J Rosenau
(74) *Attorney, Agent, or Firm* — SCHWEGMAN LUNDBERG & WOESSNER, P.A.

(57) ABSTRACT

Various embodiments include a mechanical amplification mechanism in a compact power unit of an electricity generator containing at least one piezoelectric element. The power units can be used singly but are also designed to be stacked, serially and/or in parallel with each other, and to be mounted within or under a substrate (e.g., a roadway or aircraft runway) such that the system achieves ultra-high-density of electricity production per unit area. Embodiments of the disclosed subject matter are therefore directed to a mechanical-to-electrical power generator, an accompanying (Continued)

power electronic-circuit, and power transmission and/or power saving into an energy-storage device. Therefore, the generated electrical power can be conditioned for, for example, transmitting to an electrical grid or for charging batteries of electrical vehicles. Other methods of formation of the power units and related systems are disclosed.

20 Claims, 38 Drawing Sheets

(51) Int. Cl.
  *H02N 2/18* (2006.01)
  *H10N 30/80* (2023.01)
(58) Field of Classification Search
  CPC ............... H01L 41/113; H01L 41/1132; H01L 41/1134; H01L 41/1136; H01L 41/1138; H02N 2/18; H02N 2/181; H02N 2/183; H02N 2/185; H02N 2/186; H02N 2/188
  USPC ........................................................ 310/339
  See application file for complete search history.

(56) References Cited

U.S. PATENT DOCUMENTS

| 2010/0045111 | A1 | 2/2010 | Abramovich et al. | |
|---|---|---|---|---|
| 2011/0248605 | A1* | 10/2011 | Lee | H02N 2/18 310/339 |
| 2011/0260583 | A1* | 10/2011 | Lee | H02N 2/18 310/339 |

OTHER PUBLICATIONS

International Application Serial No. PCT/US2019/044549, International Search Report dated Nov. 25, 2019, 3 pgs.
International Application Serial No. PCT/US2019/044549, Written Opinion dated Nov. 25, 2019, 8 pgs.
Guzman, Plinio, et al., "Design and Testing of Amplification Frame for Piezoelectric Energy Harvester", Young Investigators Review, [Online] Retrieved from the Internet: <URL: https://sbyireview.com/2015/11/19/design-and-testing-of-amplification-frame-for-piezoelectric-energy-harvester/r>, (Nov. 19, 2015), 22 pgs.

* cited by examiner (SECTION A-A)

HIGH-POWER-DENSITY PIEZOELECTRIC ENERGY HARVESTING SYSTEM

CLAIM OF PRIORITY

This patent application is a U.S. National Stage Filing under 35 U.S.C. 371 from International Application No. PCT/US2019/044549, filed on Jul. 31, 2019, and published as WO 2020/028592 A1 on Feb. 6, 2020, which claims priority to U.S. Provisional Application Ser. No. 62/712,877, entitled, "ULTRA-HIGH-POWER-DENSITY ROADWAY PIEZOELECTRIC ENERGY HARVESTING SYSTEM," filed 31 Jul. 2018; and U.S. Provisional Application Ser. No. 62/854,832, filed 30 May 2019, and entitled, "CIRCUITS FOR PIEZOELECTRIC ENERGY-HARVESTING SYSTEM FROM MOVING VEHICLES," the disclosures of which are each incorporated herein by reference in their entireties.

TECHNICAL FIELD

The subject matter disclosed herein relates to system technologies for converting mechanical energy of passing pedestrians and vehicles on, for example, sidewalks, highways, and streets, to electricity using piezoelectric materials. In particular, in one exemplary embodiment, the disclosed subject matter describes a mechanical amplification mechanism in a compact power unit of an electricity generator containing one or more piezoelectric elements.

STATEMENT OF STATE SPONSORED RESEARCH

The disclosed subject matter has resulted from the research work carried out on campus of the University of California, Merced, sponsored by a grant from the California Energy Commission (Agreement Number: EPC-16-049).

BACKGROUND

Heavy traffic of ground-based vehicles and pedestrians on, for example, highways, streets, and sidewalks provides considerable mechanical energy. Harvesting this mechanical energy as electricity with piezoelectric under-pavement generators has been considered, but only in small-scale operations. Contemporaneous advanced piezoelectric materials and devices have matured to a point that a large-scale implementation under highways and streets has become realistic and economical. Therefore, there is a huge potential source of electricity supply in, for example, the nation's highway system and major cities.

Piezoelectric energy-harvesters (PEHs) have attracted much attention because they can harvest energy from the ubiquitous vibration or motion energies with small displacements (even down to a nanometer-level range) in the ambient environment without being affected by the weather [e.g., see references 1-8]. For example, Shenck and Paradiso [reference 6] have demonstrated that a pair of shoes with an embedded PEH can harvest 8.4 mW of electrical power from walking.

With reference to FIG. 1A, a cantilever beam-based energy harvester 100 of the prior art is shown. The cantilever beam-based energy harvester 100 operates in a resonance mode and includes a mass 107 causing a top beam 101 to be in tension and a bottom beam 103 to be in compression. At least one of the beams 101, 103 comprises a piezoelectric material. A deflection 109 caused by the mass 107 produces a voltage, V, in a circuit 105 caused by the deflection 109 of at least one of the beams 101, 103. The cantilever beam-based energy harvester 100 has been the basis for over 1000 research papers. Roundy and Wight [reference 7] have shown that a 1 cm$^3$ cantilever beam type PEH can harvest 375 μW electrical power at 120 Hz and with 2.5 m/s$^2$ acceleration.

FIG. 1B shows an edge-clamped, circular-diaphragm harvester 130 of the prior art that includes a top beam 131, a bottom beam 132, a top electrode 133 and a bottom electrode 135. The beams 131, 132 span a distance between two fixed walls 137 over a length, L. The top beam comprises a lead zirconate titanate (PZT) material and the bottom beam 132 comprises a non-PZT material. The edge-clamped, circular-diaphragm harvester 130, when deflected, can produce from approximately 1 mW to 20 mW from the electrodes 133, 135, with a high resonance-frequency of greater than 1000 Hz and is suitable for acoustic pressure-based operations.

With reference now to FIG. 1C, a cymbal-type flextensional harvester 150 of the prior art is shown that includes a PZT material 151 interposed between two metal endcaps 153. When the two metal endcaps 153 are forced from a first position 157 to a second position 155, electrical power is generated across the PZT material 151.

A research group at the Pennsylvania State University [references 9 and 10] performed pioneering breakthrough studies by introducing the Cymbal®, which is a "31" mode (described below) flextensional piezoelectric energy harvester similar to the cymbal-type flextensional harvester 150 of FIG. 1C. The University research group harvested 52 mW with a mechanical-to-electric energy conversion efficiency as high as 7.8% at 100 Hz under a 70 N dynamic force. The University experiment advanced the overall power output for a single piece of PEH from the level of milliwatts to the level of tens of milliwatts, which is the highest value previously published in the literature on the subject.

The "31" mode described above, and other modes described herein, refers to a coordinate-axis/shear system used and known in the art. For example, Table I, below defines some of the nomenclature.

TABLE I

| Reference Number | Axis |
|---|---|
| 1 | x |
| 2 | y |
| 3 | z |
| 4 | Shear around x |
| 5 | Shear around y |
| 6 | Shear around z |

One summary of contemporaneous state-of-the-art piezoelectric energy harvesters is found in the literature [e.g., reference 11]. However, the PEHs reported in those studies have very limited application capabilities because the electronic devices and sensors need more than 100 mW to be fully powered.

As is known to a person of ordinary skill in the art, the research, development, and manufacturing of piezoelectric ceramic and polymer materials have a long history dated back to the era of the cold war. There have been extensive studies of piezoelectric conversion efficiency, individual device reliability, and endurance. Recent technological and research advances have offered the opportunity to take a systematic approach to developing large-scale piezoelectric energy harvesting systems by applying current knowledge to economically viable applications of benefit to society.

The information described in this section is provided to offer the skilled artisan a context for the following disclosed subject matter and should not be considered as admitted prior art.

DETAILED DESCRIPTION

Disclosed herein are various examples of proprietary designs of piezoelectric energy harvesting devices used on various substrates (e.g., pavements and paved surfaces such as vehicular substrates and pedestrian substrates), such as roadways, highways, airport runways, airport tarmacs, walking paths, bicycle paths, and so on. In particular, the disclosed subject matter discloses, in various embodiments, a mechanical amplification mechanism in one compact power unit of an electricity generator containing multiple piezoelectric stacks (power units). The power units are designed to be stacked to reach a certain depth underneath the pavement so that the system achieves ultra-high density of electricity per unit area. The disclosed subject matter further discloses methods to integrate the piezoelectric power generator, power electronic circuit, and power transmission grids or devices.

Also, disclosed herein are various examples of collection of electrical energy harvested from proprietary designs of piezoelectric energy-harvesting devices used on various substrates (e.g., pavements), such as roadways, highways, airport runways, walking paths, and so on and the storage of energy produced therefrom. In particular, the disclosed subject matter describes, in various embodiments, circuitry for power conditioning and energy harvesting from stressed piezoelectric-crystals (e.g., lead zirconate titanate $(PbZr_xTi_{1-x}O_3)$, or PZT) on the aforementioned substrates. The electrical charge that appears at the terminals of the various PZT stacks may be stored in order to be utilized as a source of energy. The disclosed subject matter addresses power electronic circuits to provide at least the following goals that have never been considered with PZT applications. The mentioned goals are fast-tracked energy storage as well as boosting components. Applications of the above-mentioned power electronic circuits to the ultra-high-density electricity generated by, for example, PZT stacks, provides a sustainable form of energy. For the first time, the researchers have developed advanced power-electronic circuits to ensure a high-efficiency energy-storage and power boost scheme that scales up energy harvesting from stressed piezoelectric-crystals in, for example, the highway traffic described above to a level that has economic value.

Figure 1A:
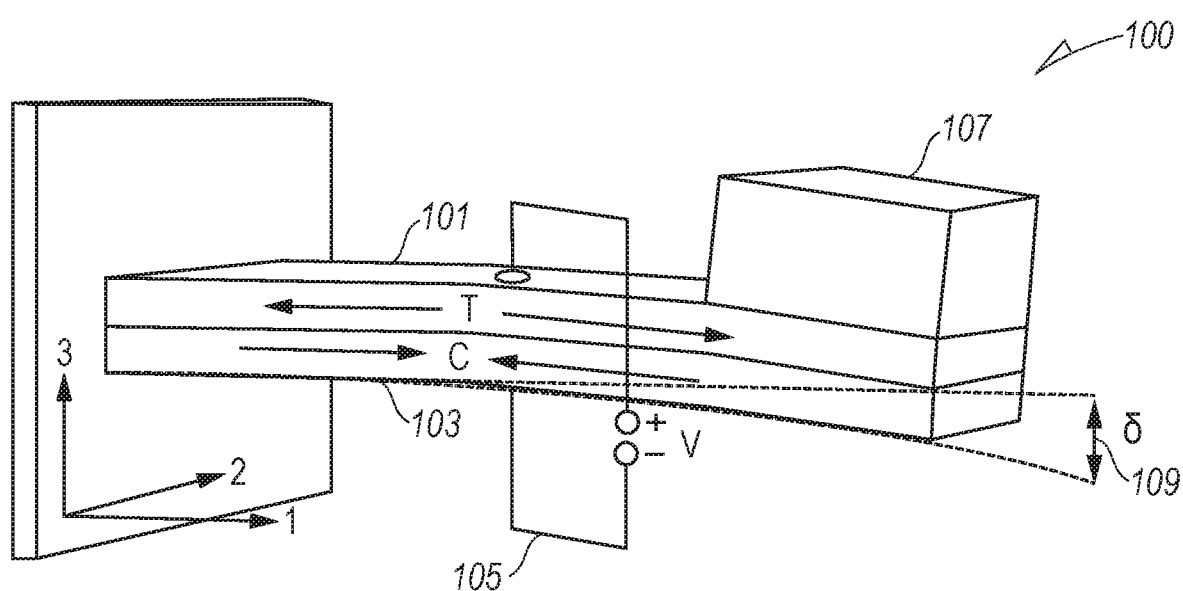
FIG. 1A shows a cantilever beam-based energy harvester of the prior art.
Figure 1B:
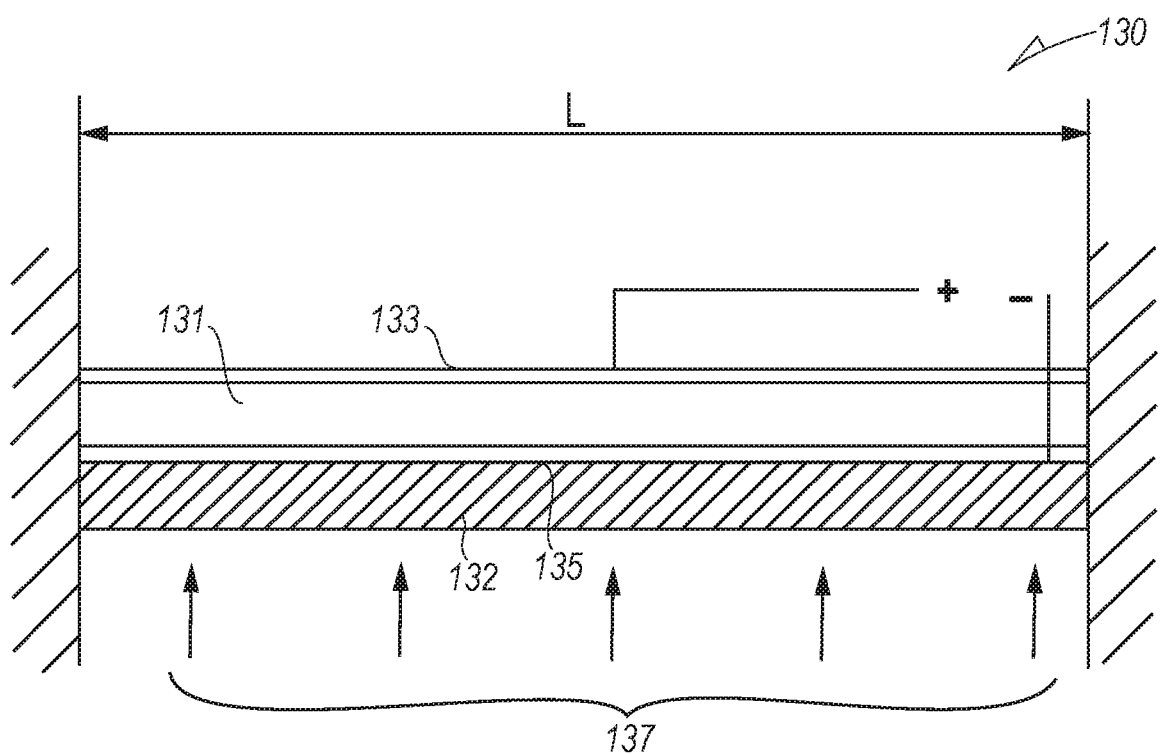
FIG. 1B shows an edge-clamped, circular-diaphragm harvester of the prior art.
Figure 1C:
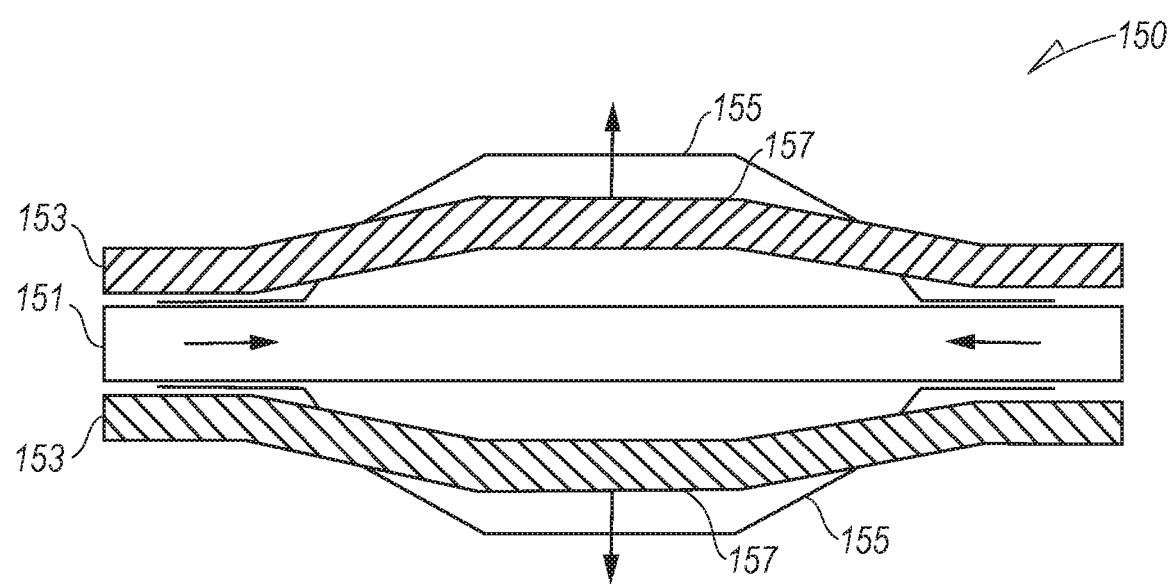
FIG. 1C shows a cymbal-type flextensional harvester of the prior art.
Figure 2:
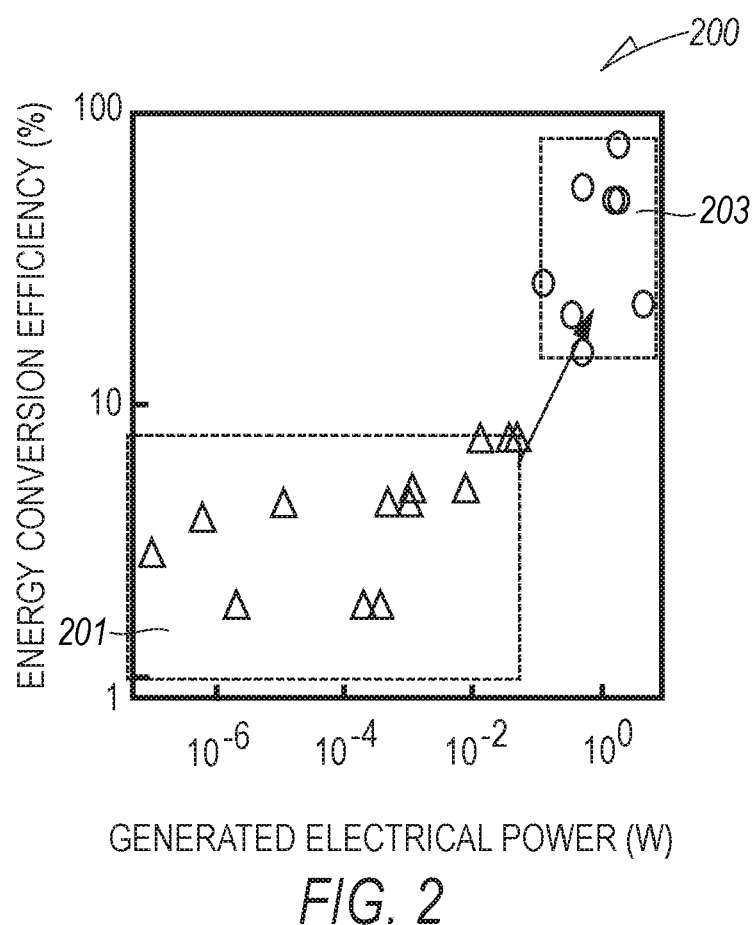
FIG. 2 shows an exemplary graph comparing the energy conversion-efficiency as a function of generated electrical power of prior art systems with the system of the disclosed subject matter.

As a basis for the research conducted with regard to the disclosed subject matter, several key technologies of advanced PEHs [e.g., from references 12-15] have been considered. FIG. 2 shows an exemplary graph 200 comparing the energy conversion-efficiency as a function of generated electrical power of prior art systems with the system of the disclosed subject matter FIG. 2 compares the best-results performance of various resonance-mode generators 201 of the prior art with the piezoelectric energy-harvesters 203 disclosed herein. A person of ordinary skill in the art will quickly recognize that the piezoelectric energy-harvesters of the disclosed subject matter have a much higher energy conversion efficiency and greater generated electrical power than any of the prior-art generators. One of the related technologies discussed herein won the 2011 best energy harvesting technology development award [reference 16], and another related technology won the 2015 Best Technology Development within Energy Harvesting and Storage [reference 17]. In the US, a federal agency known as the National Aeronautics and Space Administration (NASA) organized a special technical webinar on 25 Aug. 2015 to highlight these technologies [reference 18]. In addition, one of the inventor's related technologies. Hybrid Piezoelectric Energy Harvesting Transducer (HYPEHT), was one of the finalists of 2016 R&D 100 award special recognition in green technology.

Therefore, disclosed herein is a multidisciplinary system approach to investigate the energy recovery potential of dual-mode piezoelectric generators, to create roadway-based piezoelectric energy-harvesting systems with ultra-high-power density and efficiency such that over 50% of the mechanical energy can be harvested as electricity.

As is described in more detail below, the exemplary piezoelectric energy-harvesting system is designed to achieve, for example, an electrical energy density of 333 $W/ft^2$ with the cost reduced to $9,010/kW and a lifetime of up to 20 years. One goal of this project is to demonstrate in the laboratory the ultra-high-capacity of electric-power generation and feasibility to implement a large-scale demonstration on highways and streets with piezoelectric under a substrate (e.g., under a roadway pavement, an airport tarmac, a sidewalk, or like structures), and also show that the proposed system will meet or exceed all expected requirements.

The subject matter described herein discloses various examples of proprietary methods and designs of piezoelectric energy harvesting devices. The harvesting devices are utilized with and harvest energy from, for example, highway traffic and system integration technologies. However, upon reading and understanding the disclosure provided herein, a person of ordinary skill in the art will recognize that the disclosed subject matter can function well in other high-traffic environments, such as airport runways and the like.

In particular, embodiments of the disclosed subject matter describe a mechanical amplification mechanism in a compact power unit of an electricity generator containing multiple piezoelectric stacks. The technology includes examples of a plurality of piezoelectric ceramic stack generators encapsulated in a multi-stage mechanical amplifier to constitute one power unit. The power units can be used singly but are also designed to be stacked to reach a certain depth underneath the substrate so that the system achieves an ultra-high-density of electricity per unit area.

The disclosed subject matter further describes various methods to integrate the piezoelectric power generator, power electronic circuit, and power transmission. Therefore, the technologies resulting from this disclosed subject matter can provide a new foundation for substrates such as highways, roadways, runways, and the like, which contain the ultra-high-density piezoelectric generators to generate electricity, and the power-electronics utility box, for example, along the highway to condition the electricity for transferring the power to the electrical grid or for charging the batteries or electrical vehicles. Such power-electronics utility boxes are known in the art and will not be discussed in detail herein.

The piezoelectric energy-harvesting system disclosed herein may be optimized for heavy trucks, as well as medium-sized family cars, other rolling-stock vehicles, and various other types of vehicles, such as airplanes. Benchmarks for heavy trucks are reported in the literature e.g., reference 19] and are listed herein. For example, consider a potential harvested-energy level based on the assumptions noted below. For heavy trucks:

1. 600 vehicles/hour passing over each lane of a highway system;
2. An average weight (vehicle plus load) of a five-axle vehicle is 14,969 kg (approximately 33,000 pounds-mass (lbm)). An average force in the vertical direction on each of ten tires is 14,969 N (approximately 3,300 pounds-force (lbf)); and
3. The speed of a vehicle is 96.6 km/h (approximately 60 mph, or 26.8 m/s, or 88 ft/s).

For a medium-sized family car:
1. 1200 vehicles/hour passing each lane, traveling at 105 km/h (approximately 65 mph), and obeying the three-second safety rule;
2. An average weight of the vehicle is 2000 kg (approximately 4400 lbm); and
3. The average force in the vertical direction on each of four tires is 4893 N (approximately 1100 lbf).

Based on the above-stated assumptions, with the design of the ultra-high density piezoelectric energy-harvesting system disclosed herein, in one hour, the electricity generated over a one-meter road is about 16.2 kWh for heavy trucks and about 2.4 kWh for medium-sized cars based on the assumptions given above.

When the vehicle passes the dual-mode piezoelectric generators, the interaction plus force along the vertical direction is 14,890 N for each wheel and the interaction time is only 0.006 second (6 msec). The piezoelectric stacks act like a spring to absorb the majority of the mechanical energy. For instance, and as explained in more detail below, if the deformation of the piezoelectric cylinder is 2 mm, the elastic energy is 29.78 J. When the piezoelectric cylinders are vibrating, 50% mechanical energy will be converted to electrical energy in a vibration cycle due to the conversion efficiency of "33"-mode lead zirconate titanate (generally defined by $PbZr_xTi_{1-x}O_3$, where ($0 \leq x \leq 1$) or PZT) type piezoelectric cylinder. If the interface circuit is well designed, 40% electrical energy produced in one vibration cycle can be stored into one or more batteries or transferred into an electrical grid. If 600 vehicles/hour pass each lane, a vehicle passes a given point every 6 seconds. Consequently, there is sufficient time to harvest significant mechanical energy into electrical energy in multiple vibration cycles. Each wheel passing the ½ feed long array of the dual mode piezoelectric generators can generate 150 J of electrical energy. The interaction force along the horizontal direction is in the same level as in the vertical direction. The high efficiency "15" mode piezoelectric effect can generate more than 50 J electrical energy for each tire passing the piezoelectric generators. If 600 vehicles of five axles each pass in an hour, the harvested electrical energy is 600,000 J/h, which amounts to 166 W per unit, or 3584 W/m² (approximately 333 W/ft²).

Harvested electrical-energy can be put into, for example, at least the following applications: (1) a power-electronic circuit with, for example, a rectifier and inductor-capacitor (LC) filter, which can condition the electricity to be a direct current (DC) voltage. The DC-based power can be used to (1) charge batteries for nearby utility applications, such as lighting and traffic signs, and/or be transmitted to a nearby electric-car charging station; (2) the DC voltage can be then converted to alternating current (AC) voltages to be transferred to an electrical grid, typically also nearby, to avoid long-distance transmission of the harvested electrical-energy, thereby reducing the cost and transmission (e.g., $I^2R$ power losses) losses; and (3) since the present design of piezoelectric generators is in the form of a battery, it may be termed a piezoelectric battery, and the piezoelectric battery can provide power to an induction-based wireless-charging-system on or under, for example, a highway for charging passing electric vehicles.

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well known process steps or structures have not been described in detail so as not to obscure the disclosed subject matter.

Figure 3A:
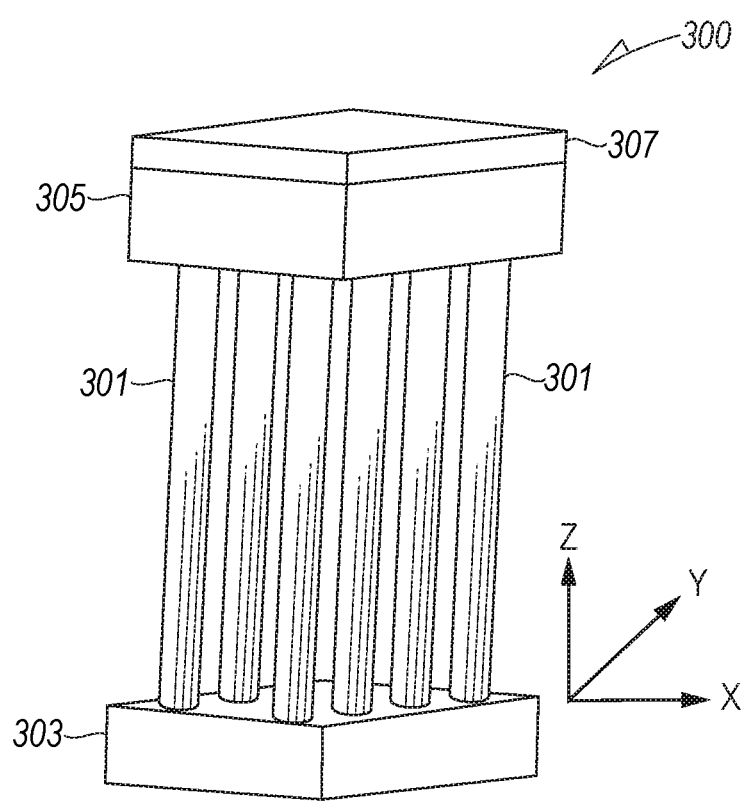
FIG. 3A shows a high-level overview diagram of an ultra-high-power-density piezoelectric-energy harvesting generator that may be embedded in, for example, a roadway or other vehicle-traveled or pedestrian-traveled area in accordance with various embodiments.

Referring now to FIG. 3A, a high-level overview diagram of an ultra-high-power-density, piezoelectric-energy harvesting generator 300 that may be embedded in, for example, a substrate such as a roadway or other vehicle-traveled or pedestrian-traveled area in accordance with various embodiments is shown. In this embodiment, the piezoelectric-energy harvesting generator 300 is shown to include a number of "33"-mode piezoelectric multilayer-cylinders 301 (described in more detail with reference to FIGS. 6A through 6F, below), an optional "15"-mode piezoelectric multilayer-plate 305, a substrate surface 307, and a base unit 303.

The "33"-mode piezoelectric multilayer-cylinders 301 are described in more detail with reference to FIGS. 6A through 6F, below. The optional "15"-mode piezoelectric multilayer-plate 305 may take various forms such as, for example, the same as or similar to the "33"-mode piezoelectric multi-layer-cylinders 301. The base unit 303 may be, for example, a concrete or other firm base below the substrate. The substrate surface 307 may be, for example, a nylon-based road surface.

Figure 3B:
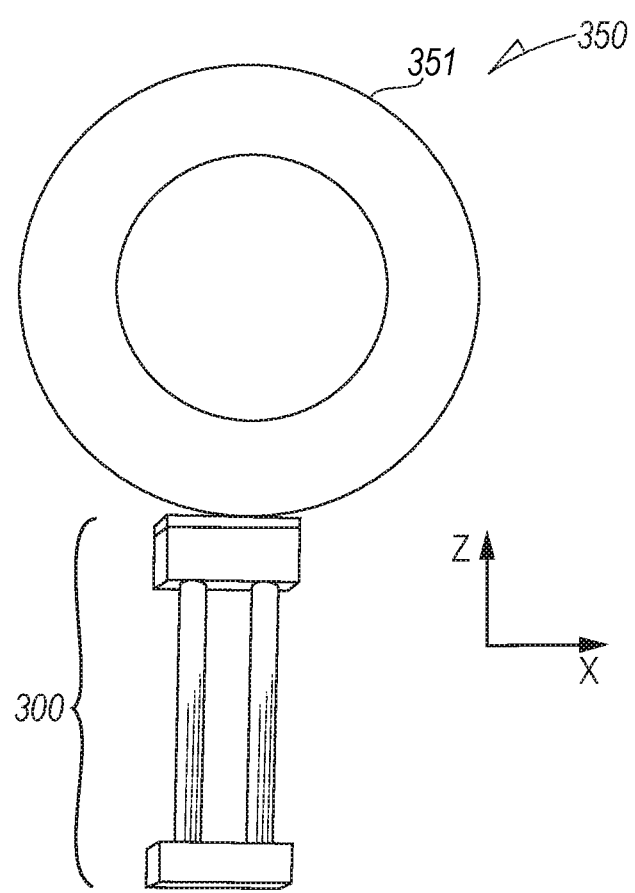
FIG. 3B shows the high-level overview diagram of FIG. 3A with an example of a vehicle tire on top of the harvesting generator.

FIG. 3B shows the high-level overview diagram of FIG. 3A, the piezoelectric-energy harvesting generator 300, with an example of a vehicle tire 351 on top of the harvesting generator. As described in more detail with regard to, for example, FIGS. 6B and 6F, below, each tower comprising two or more power-generator units generates approximately 155 V peak output at about 0.8 amps of current for each tire going over the tower. Further, a composite version 350 of the piezoelectric-energy harvesting generator 300 with vehicle tire 351 is helpful in understanding the various embodiments presented herein, as well as the equations of motion presented below.

Figure 4:
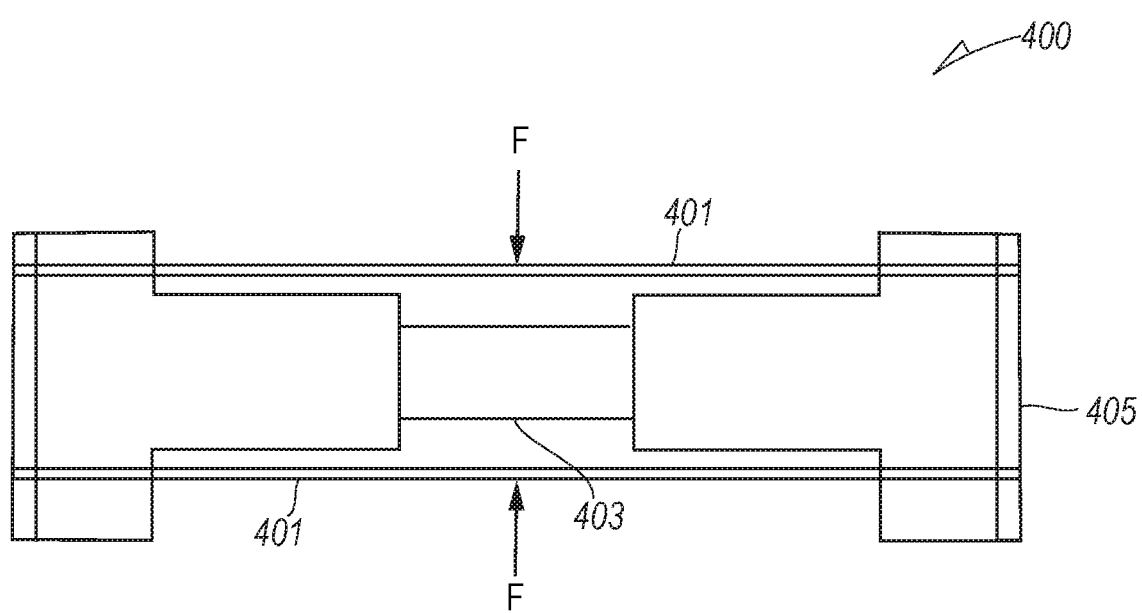
FIG. 4 shows an example of a high-level overview provided as a basis for an understanding of the disclosed subject matter, according to various exemplary embodiments.

Further, FIG. 4 shows an example of a high-level overview of a power-generator unit 400 provided as a basis for an understanding of the disclosed subject matter, according to various exemplary embodiments. The power-generator unit 400 of FIG. 4 is shown to include a piezoelectric stack 403, a base holding-structure 405, and, in this example, a pair of non-linear elastic beams 401.

The piezoelectric stack 403 (described in more detail below but may comprise, for example, one or more PZT material stacks). The base holding-structure 405 may comprise a structure designed to prevent or reduce a sliding motion or movement of the piezoelectric stack 403 or the pair of non-linear elastic beams 401. The pair of non-linear elastic beams 401 may comprise, for example, titanium plates or other types of elastic materials. As a force, F, is applied to the pair of non-linear elastic beams 401, the piezoelectric stack 403 is compressed, thereby generating electrical power. The force, F, is mechanically amplified due to the unique structure of the power-generator unit 400. Each of the various components is described in more detail with reference to FIGS. 6A through 6F, below.

Mathematical Modeling
Equations of Motion

The power-generator unit (e.g., the power-generator unit 400 of FIG. 4) consists of a mechanism that converts the vertical compressive load (e.g., the force, F) of the vehicles to that on the piezoelectric stacks (e.g., the piezoelectric stacks 403). As noted in various ones of the figures, the conversion mechanism has two elastic beam elements (e.g., the pair of non-linear elastic beams 401). The equations of motion for the beam are obtained via Hamilton's principle as $$\rho_b A_b \frac{\partial^2 U}{\partial t} - E_b A_b \left( \frac{\partial^2 U}{\partial x^2} + \frac{\partial W}{\partial x} \frac{\partial^2 W}{\partial x^2} \right) = 0 \qquad (1)$$

$$\rho_b A_b \frac{\partial^2 W}{\partial t^2} + E_b I_b \frac{\partial^4 W}{\partial x^4} - \qquad (2)$$

$$E_b A_b \left( \frac{\partial^2 U}{\partial x^2} \frac{\partial W}{\partial x} + \frac{\partial U}{\partial x} \frac{\partial^2 W}{\partial x^2} + \frac{3}{2} \left( \frac{\partial W}{\partial x} \right)^2 \frac{\partial^2 W}{\partial x^2} \right) = \left[ H \left( x - \frac{l_b}{2} + \frac{l_f}{2} \right) - H \left( x - \frac{l_b}{2} - \frac{l_f}{2} \right) \right] * F$$

where W is the deflectional displacement, U is the axial displacement, $E_b$ is Young's modulus of elasticity, $\rho_b$ is the mass density, $l_b$ is the length of the beam, $A_b$ is the cross-sectional area of the beam, $I_b$ is the area moment of inertia about the neutral axis, F is the magnitude of the vehicle load, and $l_f$ is the length of distributed load F on the beam. The boundary conditions of W and U at x=0 and x=$l_b$ are given by $$E_b A_b \left( \frac{\partial U(l_b, t)}{\partial x} + \frac{1}{2} \left( \frac{\partial W(l_b, t)}{\partial x} \right)^2 \right) = \frac{1}{2} P(t) \qquad (3)$$

$$U(0, t) = 0, \quad U(l_b, t) = 0 \qquad (4)$$

$$W(0, t) = 0, \quad \frac{\partial^2 W(0, t)}{\partial x^2} = 0, \qquad (5)$$

$$W(l_b, t) = 0, \quad \frac{\partial^2 W(l_b, t)}{\partial x^2} = 0$$

where P(t) is the axial load on the beam due to the coupling with the piezoelectric element.

The piezoelectric constitutive equations read $$\sigma = G\varepsilon - eE$$

$$D = \varepsilon^T E + e\varepsilon \qquad (6)$$

where $\sigma$ and $\varepsilon$ are the stress and strain in the thickness direction of the piezoelectric layer, respectively, D is the electric displacement and E is the electric field. G is the modulus of elasticity. Z is the dielectric permittivity constant and e is the PZT coupling coefficient defined as e=$Gd_{33}$ where $d_{33}$ is the piezoelectric constant.

The equations of motion for a multi-layer piezoelectric generator are obtained with Hamilton's principle as $$-\rho_p A_p \frac{\partial^2 V_i}{\partial t^2} + GA_P \frac{\partial^2 V_i}{\partial x^2} + eA_p \frac{\partial^2 \varphi_i}{\partial x^2} = 0, \; i \in [1, n] \qquad (7)$$

$$GA_P \frac{\partial^2 V_i}{\partial x^2} - eA_p \frac{\partial^2 \varphi_i}{\partial x^2} = 0, \; i \in [1, n] \qquad (8)$$

where V is the axial displacement and $\varphi$ is the electric potential function. The strain of the material is given by $$\varepsilon = \frac{\partial V}{\partial x}$$

while the electric field strength in the material reads $$E = -\frac{\partial \varphi}{\partial x} \cdot \rho_p$$

is the mass density, $A_p$ is the cross-sectional area of the piezoelectric generator, n is the number of piezoelectric layers.

The boundary conditions at both ends of the piezoelectric generator are given by $$-GA_P \frac{\partial V_n(d_{2n}, t)}{\partial x} + eA_p \frac{\partial \varphi_n(d_{2n}, t)}{\partial x} = P(t) \qquad (9)$$

$$-GA_P \frac{\partial V_1(d_1, t)}{\partial x} - eA_p \frac{\partial \varphi_1(d_1, t)}{\partial x} = P(t) \qquad (10)$$

$$e \frac{\partial V_n(d_{2n}, t)}{\partial x} - \varepsilon^T \frac{\partial \varphi_n(d_{2n}, t)}{\partial x} = 0 \qquad (11)$$

$$e \frac{\partial V_n(d_{2n}, t)}{\partial x} - \varepsilon^T \frac{\partial \varphi_n(d_{2n}, t)}{\partial x} = 0 \qquad (12)$$

The continuity of displacements and electric potential between the layers are imposed. Finally, the displacement coupling of the beam and piezoelectric element is defined as $$U(l_b, t) = V(nd, t) \qquad (13)$$

where d is the thickness of a piezoelectric layer.

The disclosed subject matter utilizes a compression-to-compression mechanical-amplification design. This design is far more compact than the known design of compression-to-extension-to-compression mechanism of the prior art and makes it possible to create piezoelectric energy harvesting systems with ultra-high density. However, the mechanical modeling of the power generator unit is highly sophisticated and requires a thorough stress-strain analysis of, for example, a nonlinear deflectional beam element coupled with the piezoelectric-stack generator. The force amplification factor of the device is defined as $$F_{amp} = \frac{P - P_0}{F} \qquad (14)$$

where $P_0$ is the pre-loading of the piezoelectric generator, P is the force in the piezoelectric generator due to the loading on the beam, and F is the amplitude of the vertical loading on the beam.

The above-described equations may be used to design the power-generator unit 400 shown in FIG. 4. The specifications of performance of the power-generating unit may be judged by, for example, the following criteria: force amplification factor, energy conversion efficiency, and safety factor.

Force Amplification Factor

Figure 5:
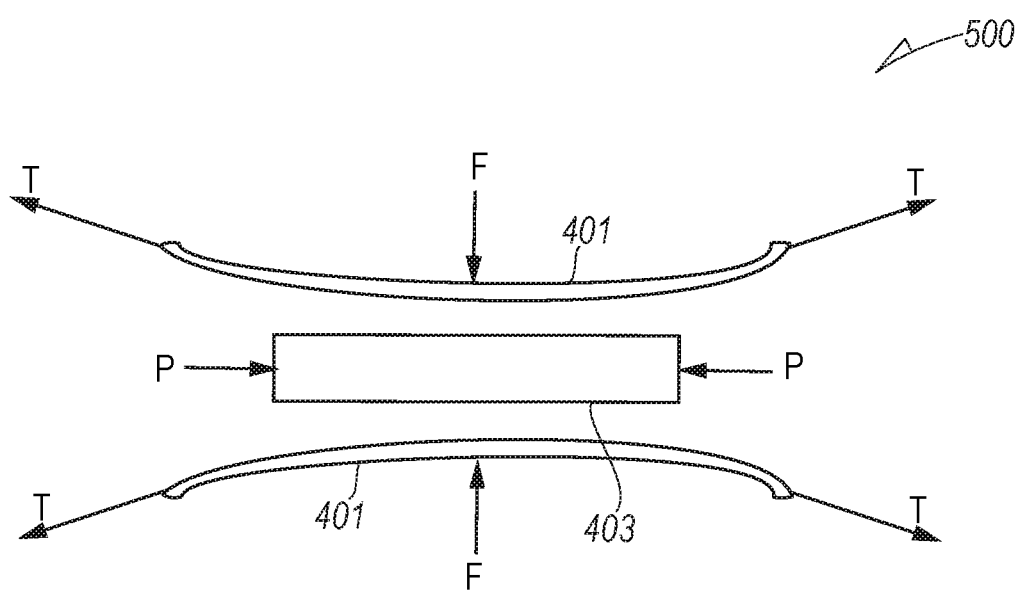
FIG. 5 shows an example of a high-level overview of an applied force, F, resulting tension, T, and internal force components, P, in an exemplary harvesting generator, according to various exemplary embodiments.

FIG. 5 shows an example of a high-level overview of an applied force, F, resulting tension, T, and internal force components, P, in an exemplary harvesting generator, according to various exemplary embodiments. FIG. 5 shows a balance of an applied force (load) F with the internal forces of the power unit. The diagram leads to an estimate of the force amplification factor through the relationships given by:

$$\begin{cases} T = \dfrac{F}{2 \tan(\alpha)} \\ P = T \cos \alpha \end{cases} \qquad (15)$$

where α<<1. When $P_0=0$, the result is $$F_{amp} \approx \frac{1}{2\sin(\alpha)} \quad (16)$$

More accurate estimates of the force amplification factor can be obtained by solving the dynamic response of the governing equations presented above.

Energy Conversion Efficiency

The electrical energy conversion efficiency of the power unit is defined as $$E_{cov} = \frac{E_e}{W_{veh}} \quad (17)$$

where $E_e$ is the electric energy stored in the piezoelectric material, $W_{veh}$ is the work done by the weight of the vehicle and $d_{max}$ is the maximum downward displacement of the vehicle.

$$E_e = \frac{1}{2}\int_v DEdv \quad (18)$$

$$W_{veh} = \frac{1}{2}W_v d_{max}$$

Safety Factor

The elastic components in the power generating unit are subject to significant mechanical forces. We have developed constraints to the design such that the maximum stress in a component will be from about 50% to about 75% of the yielding strength of the material.

Exemplary Optimal Designs

From the mathematical model of the power unit, a multi-objective optimization of mechanical designs may be performed so that various dimensions of the design can lead to a wide range of performances (see, for example, Table I). In particular, the mechanical designs can be achieved such that they can be fabricated and operate in a safe mode with sufficiently long fatigue life. For example, the following amplification factor, $F_{amp}$, can be achieved with an efficiency, $E_e$, as show below:

$$2 < F_{amp} < 20, 5\% < E_e < 10\% \quad (19)$$

Various specific exemplary embodiments for various mechanical components, along with related materials from which the components may be constructed, to manufacture various ones of the exemplary embodiments of the harvester power units and related power-unit cylinders described herein are shown with reference to FIGS. 6A through 6F. A small portion of various parameters considered in design of the mechanical components and as used within the governing equations shown above, are shown in Table I, below.

In one specific exemplary embodiment, the specifications for one material that has been found suitable and may be used for the power-generator units. One such material is a piezo-ceramic material is Sonox® P505. Sonox® P505 is a lead zirconium titanium oxide that is available from CeramTec GMBH, CeramTec-Platz 1-9, 73207 Plochingen. Germany). However, a number of other materials can be utilized as well. For example, although the current design is optimized for the commercially available material lead zirconium titanium oxide Sonox® P505 manufactured by CeramTek, the disclosed subject matter can function with other known piezoelectric ceramics as well. Some examples are listed below:

Potassium sodium tartrate;
  Barium titanate;
  Lead zirconate titanate;
  Polyvinylidene fluoride;
  Aluminum nitride;
  Quartz;
  Lithium tantalite;
  Gallium phosphate;
  Sodium bismuth titanate;
  Barium Titanium Oxide;
  Lead Zirconium Titanium Oxide;
  Barium Titanate Piezoelectric;
  Lead Zirconium Titanate Piezoelectric;
  Lead Titanate Piezoelectric;
  Lead Magnesium Niobate Piezoelectric;
  Lead Nickel Niobate Piezoelectric;
  Lithium Tantalum Oxide;
  Lead Lanthanum Zirconate Titanate; and
  Modified Lead Metaniobate:

Upon reading and understanding the disclosure provided herein, a person of ordinary skill in the art will recognize that other types of materials, or combinations of the materials shown and/or combinations of these materials with other materials not explicitly shown, may be used as well.

Figure 6A:
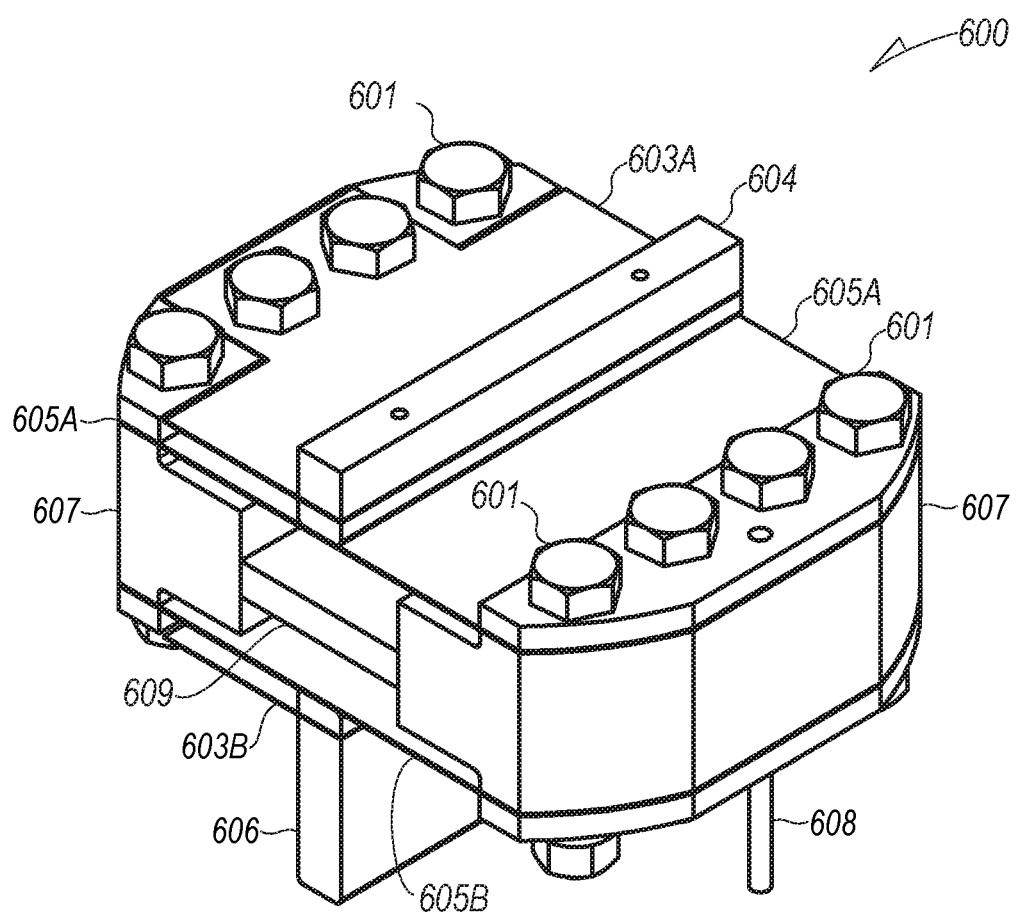
FIG. 6A shows an example of an energy-harvester power-unit in accordance with an embodiment of the disclosed subject matter.

With reference now to FIG. 6A, an example of an energy-harvester power-unit 600 in accordance with an embodiment of the disclosed subject matter is shown. At a high level, the energy-harvester power-unit 600 may be considered the same as or similar to any of the power-generator units described herein, such as the power-generator unit 400 of FIG. 4. The energy-harvester power-unit 600 is shown to include a piezoelectric element 609 mechanically attached within a cavity (opening) of a structural block 607, an upper elastic-beam 605A, a lower elastic-beam 605B, an upper contactor-arm 603A, a lower contactor-arm 60311, an upper force-contact bar 604, and a lower force-contact bar 606. An alignment pin 608 (more than one may be present although only one is shown in FIG. 6A) allows the energy-harvester power-unit 600 to be stacked with other power units.

Each of the components of the energy-harvester power-unit 600, except for the piezoelectric element 609, upper contactor-arm 603A, the lower contactor-arm 603B, the upper elastic-beam 605A, and the lower elastic-beam 605B may comprise machined or otherwise formed iron-based materials such as various types of steels including carbon steel and other steel alloys. In one specific exemplary embodiment, the structural block 607, the upper force-contact bar 604, the lower force-contact bar 606, and the alignment pin 608 comprise low-carbon steel.

The upper contactor-arm 603A and the lower contactor-arm 603B may comprise various types of elastic material that allow the upper force-contact bar 604 and the lower force-contact bar 606 to return to a neutral position after force has been applied to the energy-harvester power-unit 600 through one or both of the upper force-contact bar 604 and the lower force-contact bar 606. In a specific exemplary embodiment, the upper contactor-arm 603A and the lower contactor-arm 603B comprise, for example, a spring-steel material.

In various embodiments, the piezoelectric element 609 has a longitudinal axis (from a left-side of the cavity of the structural block 607 to the right-ide). At a high level, the piezoelectric element 609 may be similar to or the same as any of the piezoelectric devices described herein, such as the piezoelectric stack 403 of FIG. 4. Therefore, the piezoelectric element 609 may comprise one or more materials and one or more layers of individual piezoelectric elements. For example, in an embodiment, the piezoelectric element 609 may comprise a piezoelectric ceramic material, such as lead zirconate titanate ($PbZr_xTi_{1-x}O_3$, where $0 \le x \le 1$). Lead zirconate titanate is commonly referred to as PZT, a ceramic perovskite-material that exhibits a piezoelectric effect. Consequently, the PZT-compound material develops a voltage (or potential difference) across two of its faces when compressed. The PZT compound also physically changes shape when an electric field is applied. In a specific exemplary embodiment, the piezoelectric element 609 comprises one or more layers of Sonox® P505, described above.

The upper elastic-beam 605A and the lower elastic-beam 605B are positioned substantially over the cavity of the structural block 607 and may comprise a number of different elastic linear and/or non-linear materials. In a specific exemplary embodiment, the upper elastic-beam 605A and the lower elastic-beam 605B comprise titanium. More specifically, in one embodiment the upper elastic-beam 605A and the lower elastic-beam 605B comprise one or more high-strength, grade 5, titanium sheets.

The upper contactor-arm 603A and the lower contactor-arm 603B each span over at least a portion of the cavity and are mechanically coupled to the upper force-contact bar 604 and the lower force-contact bar 606, respectively. The mechanical coupling may be achieved by any means known in the art such as, for example, mechanical machine screws, bolts, rivets, etc. or various types of chemically-based coupling agents such as adhesives. The upper force-contact bar 604 and the lower force-contact bar 606 have are positioned substantially over the cavity and have a longitudinal axis from a front portion of the structural block 607 to a back portion of the structural block (as viewed in FIG. 6A) and are therefore substantially perpendicular to a longitudinal axis of the piezoelectric element 609.

The structural block 607, the upper contactor-arm 603A, the lower contactor-arm 603B, the structural block 607, the upper elastic-beam 605A, the lower elastic-beam 605B, and the piezoelectric element 609 are bound together by a number of fastening elements 601. The fastening elements 601 may comprise various types of mechanical fasteners such, for example bolt and nut combinations. In a specific exemplary embodiment, the fastening elements 601 comprise hex bolts and nuts with a high ISO strength-rating (or property class).

Figure 6B:
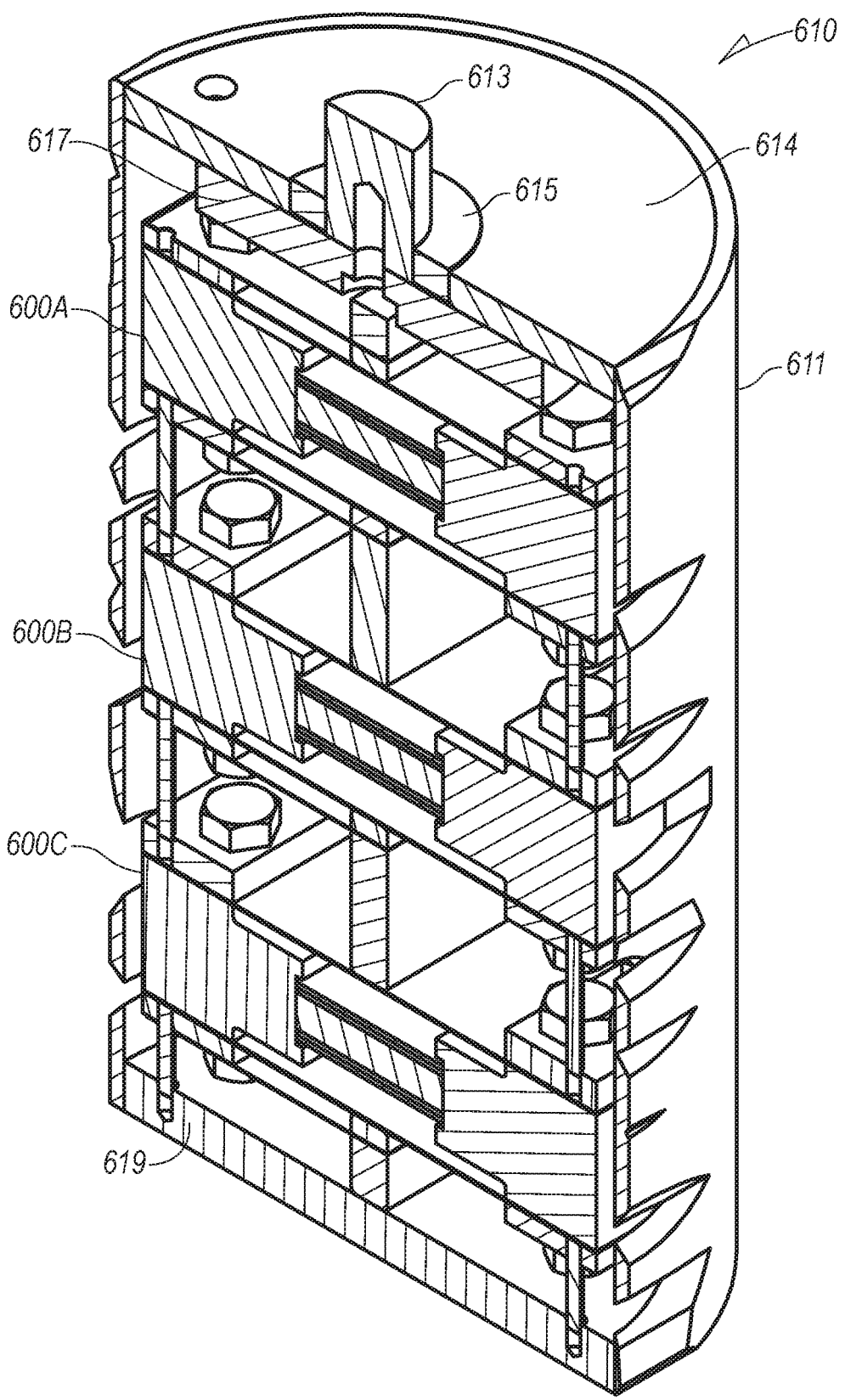
FIG. 6B shows an example of several energy-harvester power-units of FIG. 6A mounted serially (e.g., one atop another) in a power-unit cylinder according to various exemplary embodiments.

FIG. 6B shows an example of several of the energy-harvester power-units 600 of FIG. 6A mounted serially (e.g., one atop another substantially parallel to each other) in a power-unit cylinder according to various exemplary embodiments. FIG. 6B is shown to include an upper energy-harvester power-unit 600A, a middle energy-harvester power-unit 600B, and a lower energy-harvester power-unit 600C. Each of the energy-harvester power-units may the same as or similar to the energy-harvester power-units 600 of FIG. 6A. Further, upon reading and understanding the disclosed subject matter, a person of ordinary skill in the art will recognize that any number of energy-harvester power-units may be used such as only a single unit to more than three units.

FIG. 6B is also shown to include a power-unit enclosure 611, a force-contact shaft 613, a bearing 615 through which the force-contact shaft 613 passes to contact an optional top-disk 617, a top cap 614, and a bottom cap 619. The power-unit enclosure 611 may comprise, for example, a tube although any shape compatible with a chosen shape of the energy-harvester power-units 600A, 600B, 600C may be chosen.

Each of the force-contact shaft 613, the force-contact shaft 613, the optional top-disk 617, the top cap 614, and the bottom cap 619 may comprise any of the metallic (e.g., iron-based) materials described above with reference to FIG. 6A. A skilled artisan will recognize that other materials may be found to be suitable as well.

The bearing 615 that surrounds the force-contact shaft 613 provides a relatively-low mechanical resistance path through the top cap 614. As is no understandable to a skilled artisan, the force-contact shaft 613 will be subjected to forces (e.g., compressive forces) placed thereon, especially at a variety of different frequencies (e.g., due to vehicular traffic). The bearing 615 thereby prevents excessive mechanical wear between the force-contact shaft 613 and the top cap 614. The bearing may comprise various types of thrust bearing known in the art. In a specific exemplary embodiment, the bearing 615 comprises an oil-embedded thrust bearing.

As force is applied to the force-contact shaft 613, the force is transmitted to the optional top-disk 617 and to the upper force-contact bar 604 (see FIG. 6A) of the upper energy-harvester power-unit 600A (and subsequently to the middle energy-harvester power-unit 600B, and the lower energy-harvester power-unit 600C). The applied force presents a compressive force (e.g., from one side to the other) along the longitudinal axis of respective ones of the piezoelectric elements 609, thereby generating electrical power.

Figure 6C:
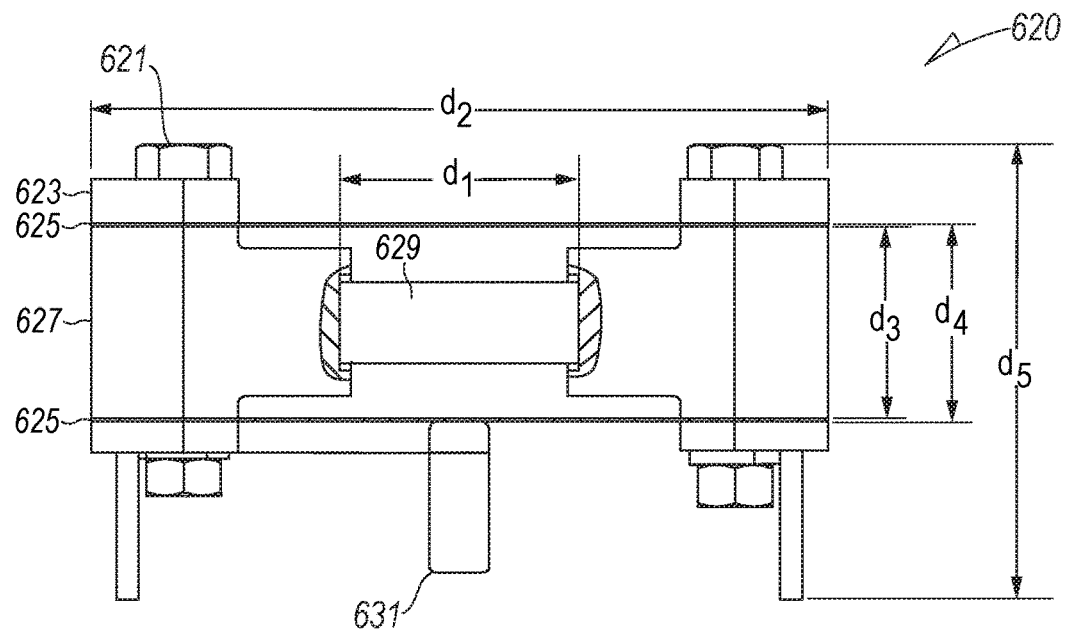
FIG. 6C shows an example of a front view of the energy-harvester power-unit of FIG. 6A, including a small cross-sectional view of the area immediately surrounding a piezoelectric material enclosed therein.

FIG. 6C shows an example of a front view 620 of the energy-harvester power-unit 600 of FIG. 6A, including a small cross-sectional view of the area immediately surrounding a piezoelectric material enclosed therein. The front view 620 of FIG. 6C is shown to include fastening elements 621, a block cover 623, a pair of elastic beams 625, a structural block 627, a piezoelectric element 629, and a lower force-contact bar 631. The front view 620 does not show the upper force-contact bar 604 of FIG. 6A to avoid obscuring the dimensional elements provided.

The small cross-sectional view of the area immediately surrounding the piezoelectric element 609 (see FIG. 6A) indicates an exemplary embodiment in which portions of the structural block 627 are notched to receive opposing ends of the piezoelectric element 609.

Each of the components of FIG. 6C may be the same as or similar to components shown and described above with reference to FIG. 6A. The block cover 623, not described explicitly with regard to FIG. 6A, may comprise any of the metallic (e.g., iron-based) materials described above with reference to FIG. 6A. A skilled artisan will recognize that other materials may be found to be suitable as well.

To better illustrate certain exemplary aspects of the front view 620 of the energy-harvester power-unit 600, dimensions are now provided to more fully elucidate the disclosed subject matter. These dimensions are exemplary only and a variety of other dimensions may be substituted. For example, an opening, $d_1$, within the structural block 627 may be about 29.4 mm (approximately 1.16 inches) and an overall length, $d_2$, of the structural block 627 may be about 100 mm (approximately 3.94 inches). A height, $d_3$, of the structural block 627 may be about 24.0 mm (approximately 0.95 inches), a combined height, $d_4$, of the structural block 627 and the pair of elastic beams 625 may be about 24.8 mm (approximately 0.98 inches), and an overall height, $d_5$, including the alignment pins 608 (see FIG. 6A) of the energy-harvester power-unit 600 may be about 56.6 mm (approximately 2.23 inches). Based on the combined height, $d_4$, of the structural block 627 and the pair of elastic beams 625 of about 24.8 mm, and assuming that each of the pair of elastic beams 625 is the same thickness, the thickness of each of the elastic beams 625 is about 0.4 mm (approximately 0.16 inches) in this specific exemplary embodiment.

Figure 6D:
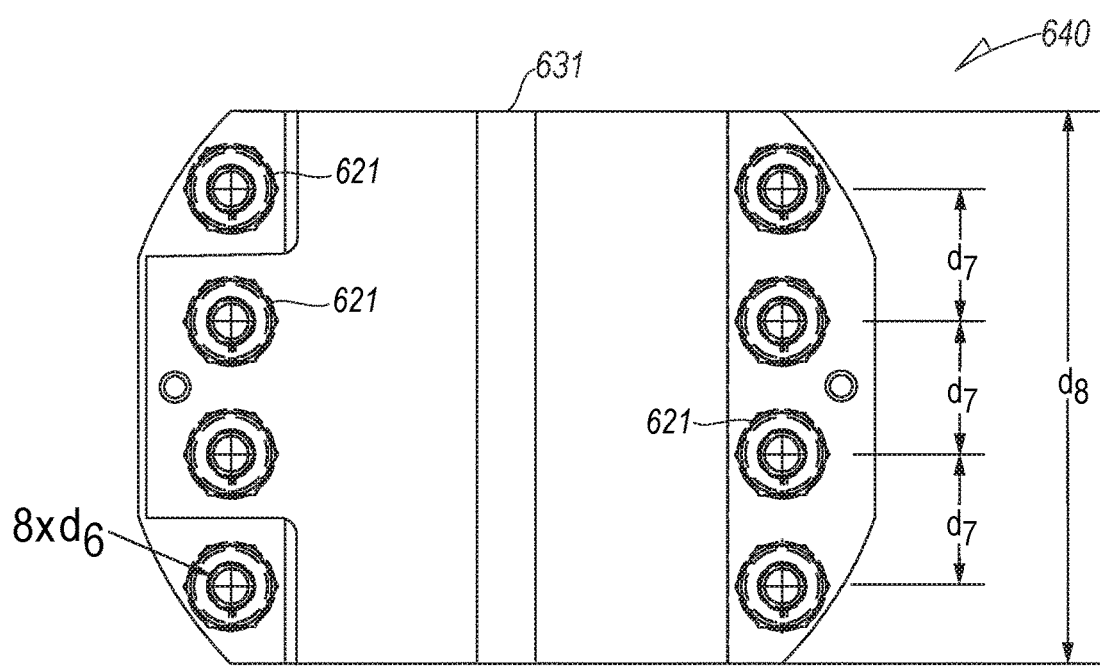
FIG. 6D shows an example of a bottom view of the energy-harvester power-unit of FIG. 6A.

FIG. 6D shows an example of a bottom view 640 of the energy-harvester power-unit 600 of FIG. 6A. To continue with certain exemplary aspects of the bottom view 640 of the energy-harvester power-unit 600, dimensions are now provided to more fully elucidate the disclosed subject matter. These dimensions are exemplary only and a variety of other dimensions may be substituted. For example, each of the fastening elements 621 (e.g., bolt and nut combinations) may comprise eight bolts having a diameter, $d_6$, of about 6.35 mm (approximately 0.250 inches) with a center-to-center spacing distance, $d_7$, of about 18.0 mm (approximately 0.71 inches). An overall width, $d_8$, of the energy-harvester power-unit 600 is about 75.0 mm (approximately 2.95 inches).

Figure 6E:
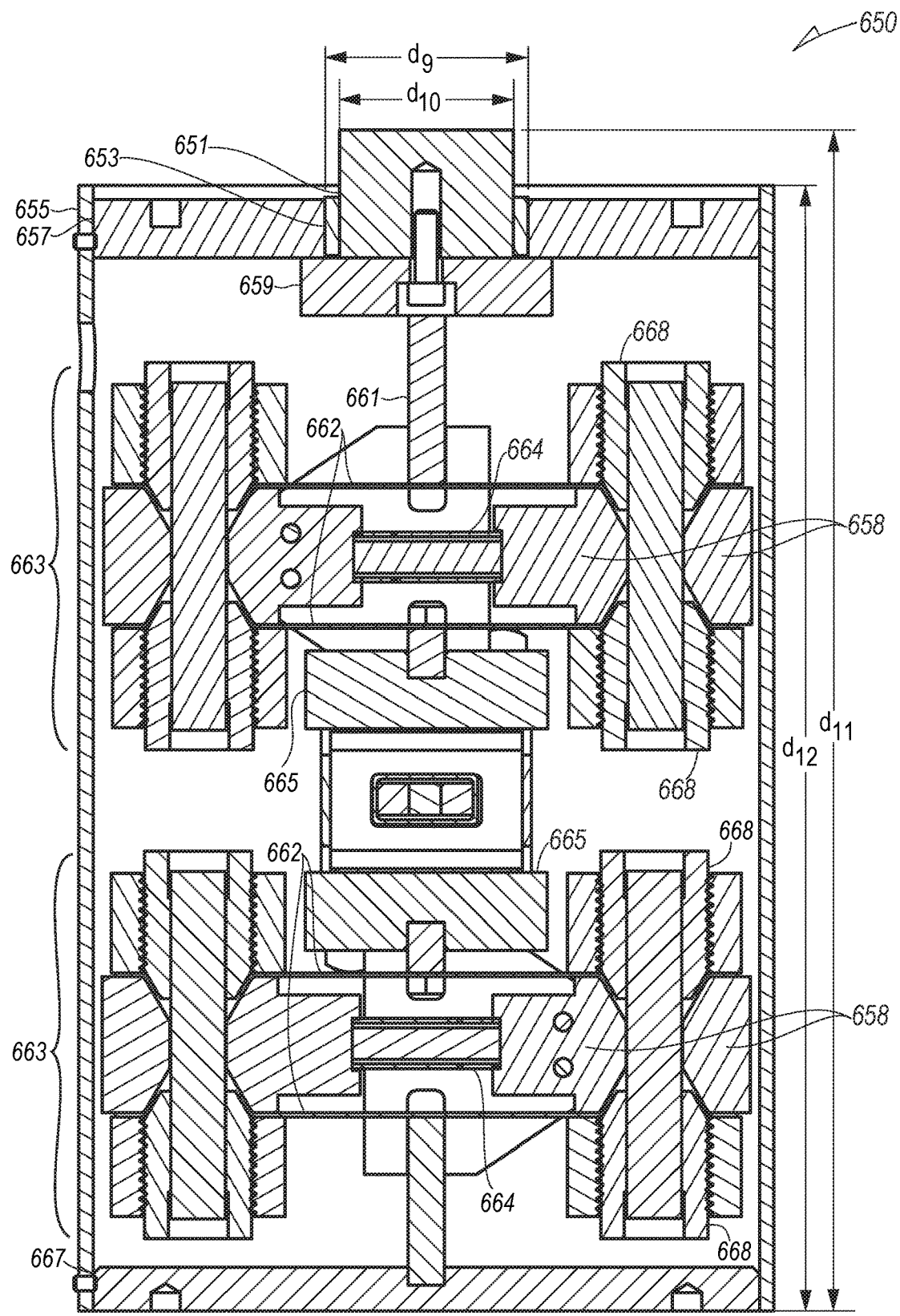
FIG. 6E shows an example of another embodiment of multiple energy-harvester power-units in which the multiple energy-harvester power-units are mounted serially (e.g., one atop another) in a power-unit cylinder according to various exemplary embodiments of the disclosed subject matter.

FIG. 6E shows an example of another embodiment of multiple energy-harvester power-units in which the multiple energy-harvester power-units are mounted serially (e.g., one atop another) in a power-unit cylinder 650 according to various exemplary embodiments of the disclosed subject matter. FIG. 6E is a cross-section of FIG. 6F, described below, at Section A-A, and is shown to include energy-harvester power-units 663 (of which two are shown) each including a force-contact bar 661, a piezoelectric element 664 mounted within a cavity of the energy-harvester power-units 663, a pair of elastic beams 662, and a cross-connector 665 (mechanically coupled between the energy-harvester power-units 663) a power-unit enclosure 655 having a top cap 657 and a bottom cap 667, and a force-contact shaft 651 that is mechanically coupled through a bearing 653 to an optional top-disk 659. As noted in FIG. 6E, the force-contact bar 661 (and similar elements, e.g., contacting respective ones of the pair of elastic beams 662) have a longitudinal axis extending into a plane of the page and therefore are substantially perpendicular to a longitudinal axis of the piezoelectric element 664, which spans across the cavity (from the left-side to the right-side as viewed in FIG. 6E) of the energy-harvester power-units 663.

Each of the components of FIG. 6E, with the exception of newly shown components described in detail immediately below, comprise similar or identical functions as those described above with reference to FIGS. 6A through 6D. Additionally, although only two of the energy-harvester power-units 663 are shown, upon reading and understanding the disclosed subject matter, a person of ordinary skill in the art will recognize that any number of energy-harvester power-units 663 may be used such as only a single unit to more than two units. The newly-shown components, for example, the conically-shaped elements 658 and the conically-shaped compression elements 668, may comprise, for example, machined or otherwise formed iron-based materials such as various types of steels including carbon steel and other steel alloys as described above with reference to FIG. 6A, as well as other suitable materials known in the art.

Further, although the energy-harvester power-units 663 are otherwise similar or identical to the energy-harvester power-unit 600 of FIG. 6A, there is a slight difference in this embodiment. For example, with concurrent reference to FIG. 6C, the opposing ends of the piezoelectric element 609 are mechanically coupled to notched portions of the structural block 627. However, with reference again to FIG. 6E, rather than piezoelectric element 664 being held within notched portions, the piezoelectric element 664 is formed within conically-shaped elements 658. The longitudinal axis of the piezoelectric element 664 spans across the cavity (from the left-side to the right-side as viewed in FIG. 6E). As a pair of conically-shaped compression elements 668, which are arranged to be matingly coupled and tightened down against respective ones of the conically-shaped elements 658, the piezoelectric element 664 is compressed even more firmly within the respective energy-harvester power-units 663, thereby providing an even higher mechanical-amplification factor since little or no variations exist between the piezoelectric element 664 and the conically-shaped elements 658 as may occur with the arrangement of FIG. 6C (e.g., due to variations in tolerances of one or more of the machined or otherwise formed components).

Consequently, the elastic beams 662 that provide compression loading on respective ones of the piezoelectric elements 664 once a force is applied to the force-contact shaft 651, are affixed to the conically-shaped elements 658 by the conically-shaped compression elements 668, which may comprise cone-shaped nuts. The conically-shaped compression elements 668 provide more contact area with the elastic beams 662, thereby substantially increasing a frictional force to hold the elastic beams 662 in place without slipping when a large vertical-load (force) is applied. Furthermore, the conical shape of the conically-shaped elements 658 by the conically-shaped compression elements 668 automatically centers the respective components, thereby leading to much improved geometrical precision and alignment. Therefore, for more advanced designs in which an even higher mechanical-amplification factor is desirable, the added complexity of the arrangement shown in FIG. 6E may be utilized.

Each of the components of FIG. 6E may comprise materials similar to or identical to those described above with reference to FIGS. 6A-6D. Additional components, such as the conically-shaped elements 658 and the conically-shaped compression elements 668 may comprise, for example, machined or otherwise formed iron-based materials such as various types of steels including carbon steel and other steel alloys as described above with reference to FIG. 6A, as well as other suitable materials known in the art.

To better illustrate certain exemplary aspects of the top view 670 of the power-unit cylinder 650, dimensions are now provided to more fully elucidate the disclosed subject matter. These dimensions are exemplary only and a variety of other dimensions may be substituted. For example, diameter, $d_{10}$, of the force-contact shaft 651 may be about 38.1 mm (approximately 1.50 inches) and a diameter, $d_9$, of the bearing 653 may be about 44.5 mm (approximately 1.75 inches). A height, $d_{12}$, of the power-unit enclosure 655 may be about 247 mm (approximately 9.72 inches) while an overall height, $d_{11}$, of the power-unit enclosure 655, from a lowermost portion of the bottom cap 667 to an uppermost portion of the force-contact shaft 651, is about 259 mm (approximately 10.2 inches).

Figure 6F:
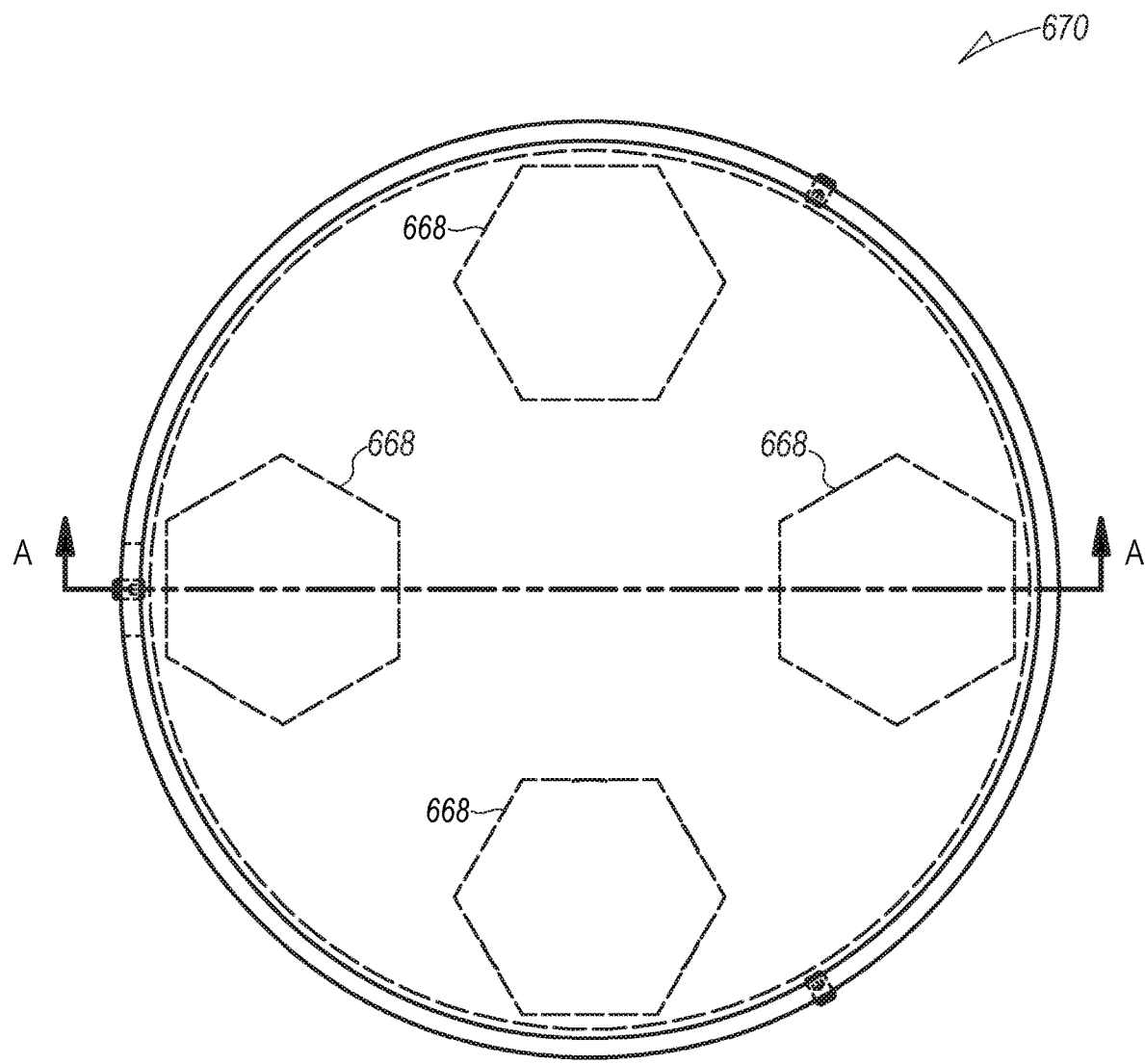
FIG. 6F shows an example of a top view of the power-unit cylinder of FIG. 6E.

FIG. 6F shows an example of a top view 670 of the power-unit cylinder 650 of FIG. 6E. As noted above, FIG. 6E is a cross-section of FIG. 6F shown at Section A-A.

Figure 7A:
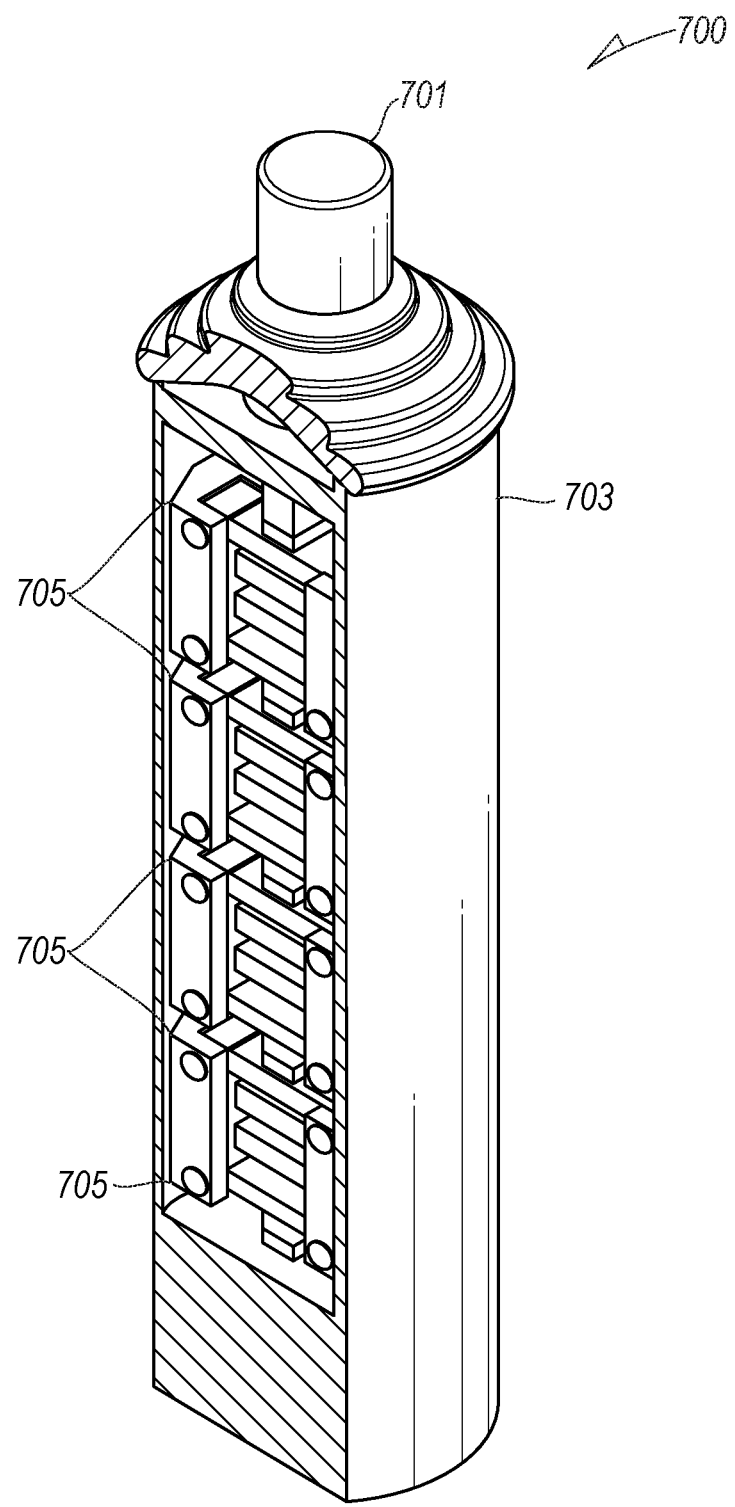
FIG. 7A shows a cut-away of an embodiment of several energy-harvester power-units mounted serially in a power-unit cylinder according to various exemplary embodiments.

FIG. 7A shows a cut-away of an embodiment of several energy-harvester power-units mounted serially in a power-unit cylinder 700 according to various exemplary embodiments. The power-unit cylinder 700 is shown to include a force-contact shaft 701, a power-unit enclosure 703, and multiple iterations of energy-harvester power-units 705. Each of the various components of FIG. 7 may be similar or identical to corresponding components of FIGS. 6A through 6F. For example, the force-contact shaft 701 may be similar to or the same as the force-contact shaft 613 of FIG. 6B or the force-contact shaft 651 of FIG. 6E. The energy-harvester power-units 705 may be the same as or similar to the energy-harvester power-units 600 of FIG. 6A or the energy-harvester power-units 663 of FIG. 6E.

Figure 7B:
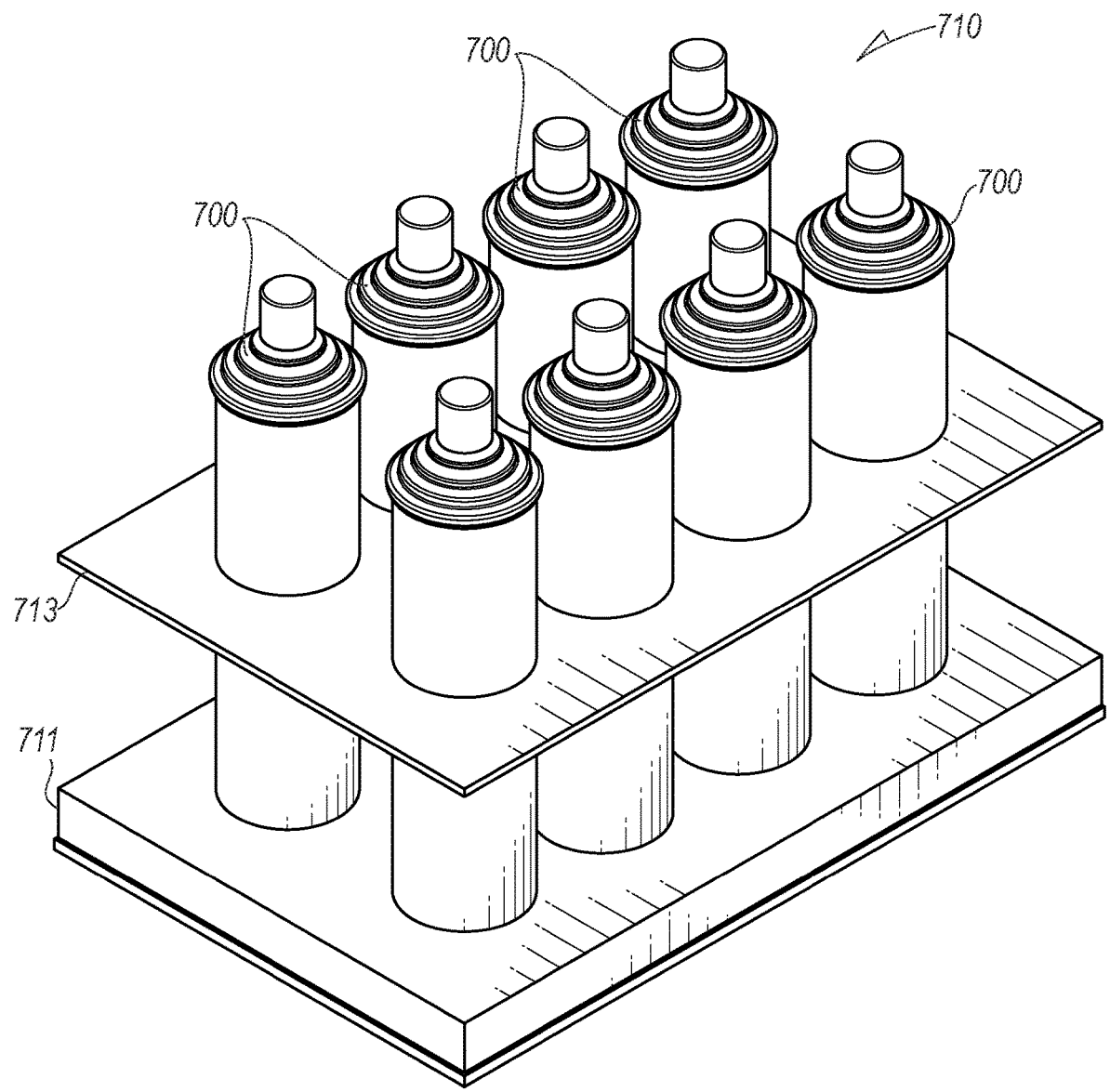
FIG. 7B shows an example of a plurality of the power-unit cylinders of FIG. 7A mounted in parallel to one another.

FIG. 7B shows an example of a plurality 710 of the power-unit cylinders 700 of FIG. 7A mounted in parallel to one another in a holding structure comprising a lower plate 711 and an upper plate 713. Since the holding structure is provided to hold individual ones of the power-unit cylinders 700 in a relative relationship to one another, the lower plate 711 and the upper plate 713 may each comprise the same or different materials including, for example, a wide range of materials including various types of metallic materials (e.g., iron, copper, aluminum, and alloys thereof) and/or various types of plastic or related materials (e.g., polyethylene, polyurethane, polypropylene, polyvinyl chloride, acrylic, and other types of, for example, polymers).

Figure 7C:
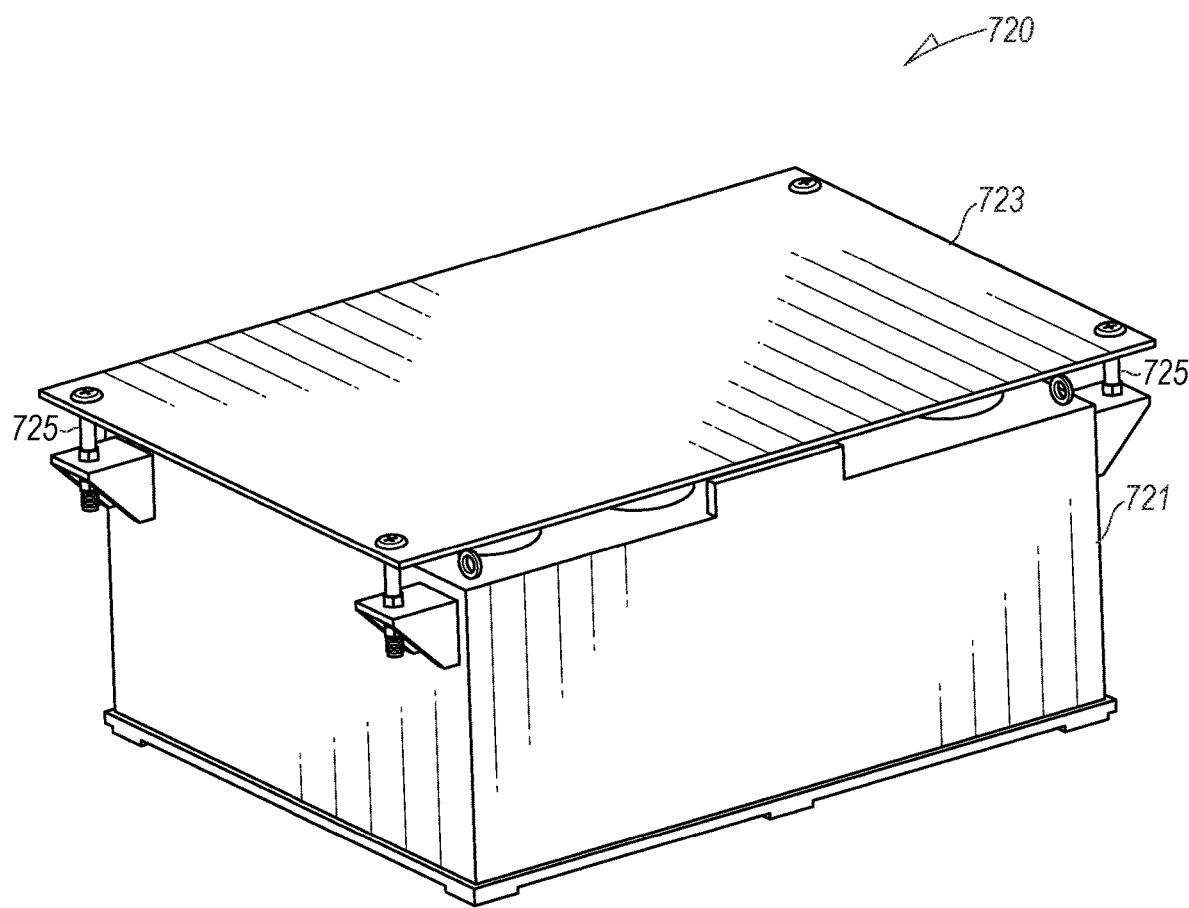
FIG. 7C shows an embodiment of a structural case for mounting the plurality of the power-unit cylinders of FIG. 7B for later embedding under a roadway, sidewalk, runway, or other vehicle-traveled or pedestrian-traveled substrate.

FIG. 7C shows an embodiment of a structural case 720 for mounting the plurality 710 of the power-unit cylinders 700 of FIG. 7B for later embedding under or within a substrate such as a roadway, sidewalk, runway, or other vehicle-traveled or pedestrian-traveled substrate. The structural case 720 includes, for example, a containment unit 721 and a top cover 723. The top cover 723 is affixed to the containment unit 721 such that most or all forces experienced by the top cover 723 are transmitted to one or more of the power-unit cylinders 700 contained within the containment unit 721. Therefore, in one embodiment, the top cover 723 may be affixed such that it may translate (or slide), vertically, along a number of alignment devices 725. In another embodiment, the top cover 723 may be made of a deformable material such that it will deform under an applied force and transmit the force to one or more of the power-unit cylinders 700 contained within the containment unit 721. In other embodiments, the top cover 723 may comprise a deformable material and translate, vertically, along the number of alignment devices 725.

The containment unit 721 and the top cover may be comprised of the same or different materials including, for example, a wide range of materials including various types of metallic materials (e.g., iron, copper, aluminum, and alloys thereof) and/or various types of plastic or related materials (e.g., polyethylene, polypropylene, polyurethane, polyvinyl chloride, acrylic, and other types of, for example, polymers). An entirety of the structural case 720 may then be contained at least partially or entirely within a concrete cavity either in or under the substrate.

Figure 8:
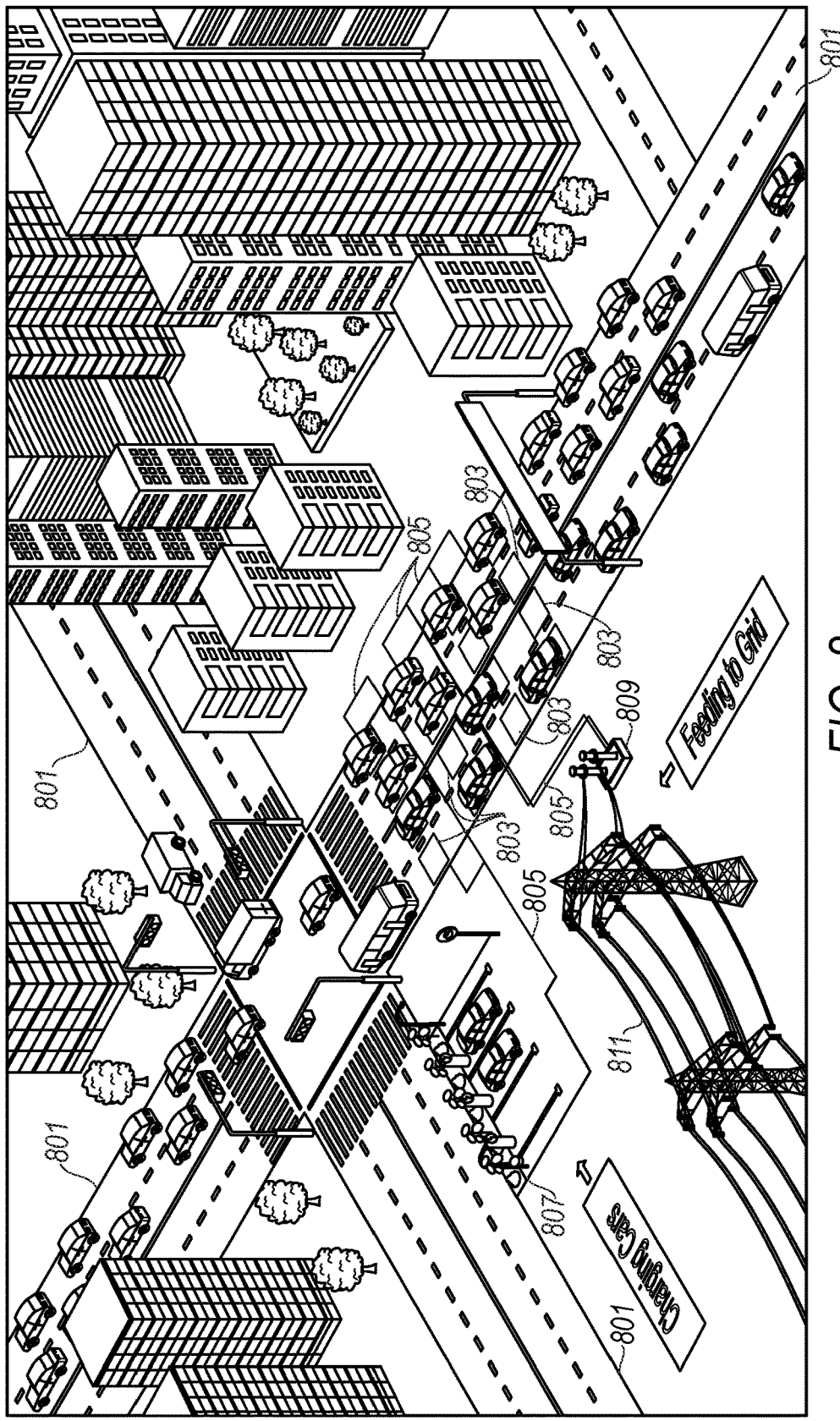
FIG. 8 is a three-dimensional rendering of how the structural cases of FIG. 7C may be mounted in numerous locations under city streets whereby the harvested mechanical-to-electrical energy derived from the harvester power-units contained within the structural cases of, for example, FIG. 7C (or the harvester power units mounted under the city streets individually or in various combinations thereof), may be linked to power a car charging-station or be fed to an electrical grid.

FIG. 8 is a three-dimensional rendering 800 of how the structural cases 720 of FIG. 7C may be mounted in numerous locations under city streets 801 whereby the harvested mechanical-to-electrical energy derived from the harvester power-units contained within the structural cases 720 of, for example, FIG. 7C (or the harvester power units mounted under the city streets individually or in various combinations thereof), may be linked to power a car charging-station 807 or be fed to an electrical grid 811. Each of the structural cases 720 of FIG. 7C are shown in FIG. 8 in selected locations 803, connected to one another, to the car charging-station 807 (or any type of vehicle charging-station), and to a grid interface 809 to transfer the energy produced by the harvester power-units contained within the structural cases 720 to the electrical grid 811. The three-dimensional rendering 800 is merely one example of how the energy produced by various embodiments of the disclosed subject matter can be utilized. Upon reading and understanding the disclosed subject matter, a person of ordinary skill in the art can readily envision numerous other ways in which the produced energy may be used.

Electrical Considerations

Various embodiments of the piezoelectric device disclosed above is a useful device for converting mechanical energy from pressure into electrical energy. The device produces different types of electrical responses to mechanical pressure. The electrical responses can be categorized generally as a sustained-pressure response and an impulse response. As pressure is increased, a voltage output of the piezo is increased. As pressure is released from the piezoelectric device, the voltage drops to the negative range. At this point the piezoelectric device is in its restoring phase back to its stability point where it outputs 0 V. When the piezoelectric device is subjected to an impulse, the device may produce a large voltage spike with a very short restoration time in the negative region.

However, there is no technology reported in the open scientific and patent literature or available in the marketplace that can create an ultra-high density piezoelectric energy-harvesting system to convert the mechanical energy of the traffic to electricity. The energy harvested from piezoelectric-material devices has not been explored in a large-scale size. Storing this type of energy and boosting the level of produced power to supply the electricity needs of power customers suggest a meticulously-designed power electronic circuit. Each of these concepts is explained in greater detail, below.

The described technologies resulting from the disclosed subject matter of the various embodiments of energy-harvester power-units (e.g., piezoelectric devices) provide a new foundation for various types of substrates, which contain ultra-high density piezoelectric generators to generate electricity, and the power electronics utility box along the substrates to condition the electricity to, for example, feeding to a grid or for charging the batteries of electrical vehicles. In order to supply electricity using this type of vibrational energy, the voltage level is boosted after one or more of the various piezoelectric devices. Peak tracking circuits are described and calibrated, and an energy storage mechanism, for example, a capacitor, is used to store the energy in an efficient way. Also, in order to supply alternating current (AC) to electricity customers, a novel inverter with a novel control scheme is also described. Therefore, in various embodiments, the disclosed subject matter describes advanced power electronic circuits to ensure a high-efficiency energy storage and power boost that scales up the energy harvesting from the substrate (e.g., highway) traffic to a level that has economic value.

Figure 9:
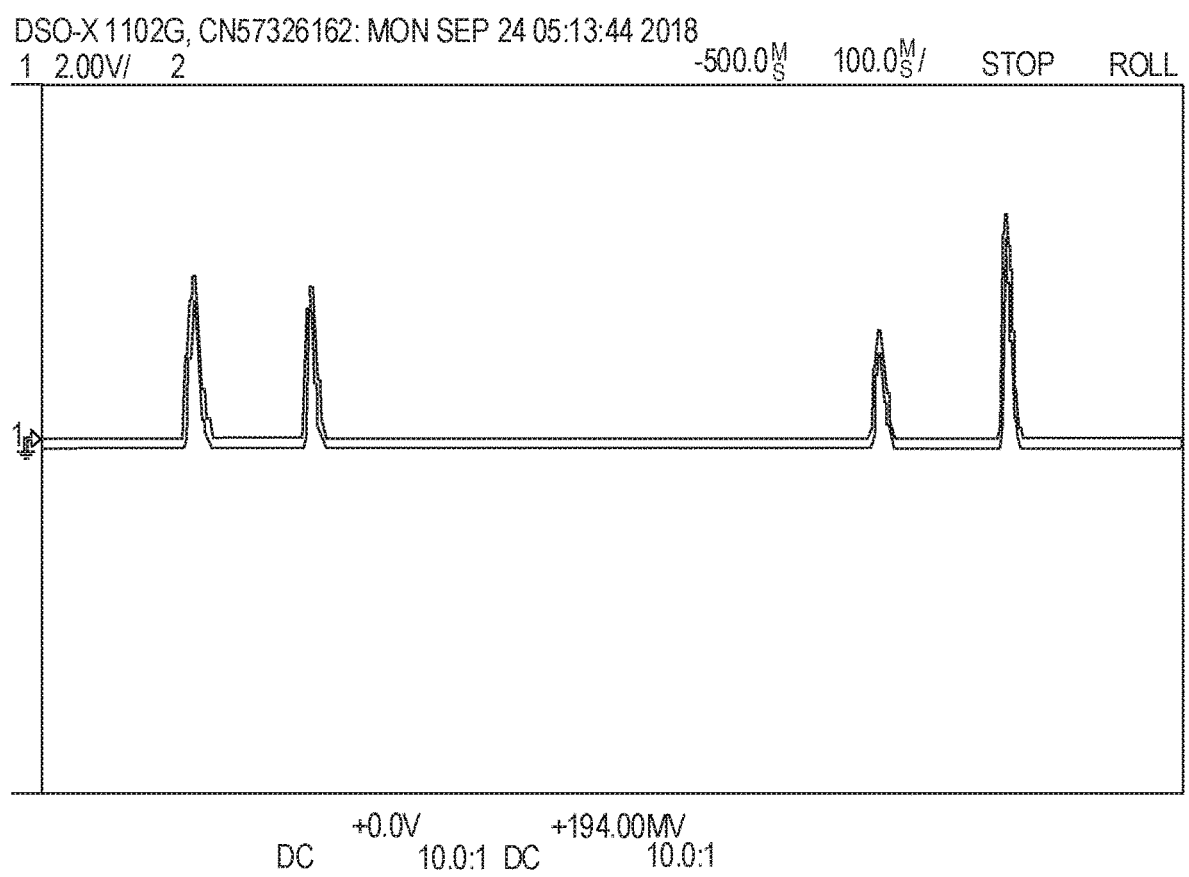
FIG. 9 shows an example of a holding response diagram for an embodiment of an electrical circuit used with the energy-harvester power-units disclosed herein.

As is known to a person of ordinary skill in the art, the piezoelectric device is a useful device for converting mechanical energy from pressure into electrical energy. AS described briefly above, the device has three main types of electrical responses to mechanical pressure including a sustained-pressure response and an impulse response. FIG. 9 shows a sustained-pressure response (e.g., a holding response). As pressure is increased, the voltage output of the piezo increases. Shortly after that pressure is released from the piezo, the voltage drops to the negative range. At this point the piezo is restoring phase back to its stability point where it outputs 0 V.

Figure 10:
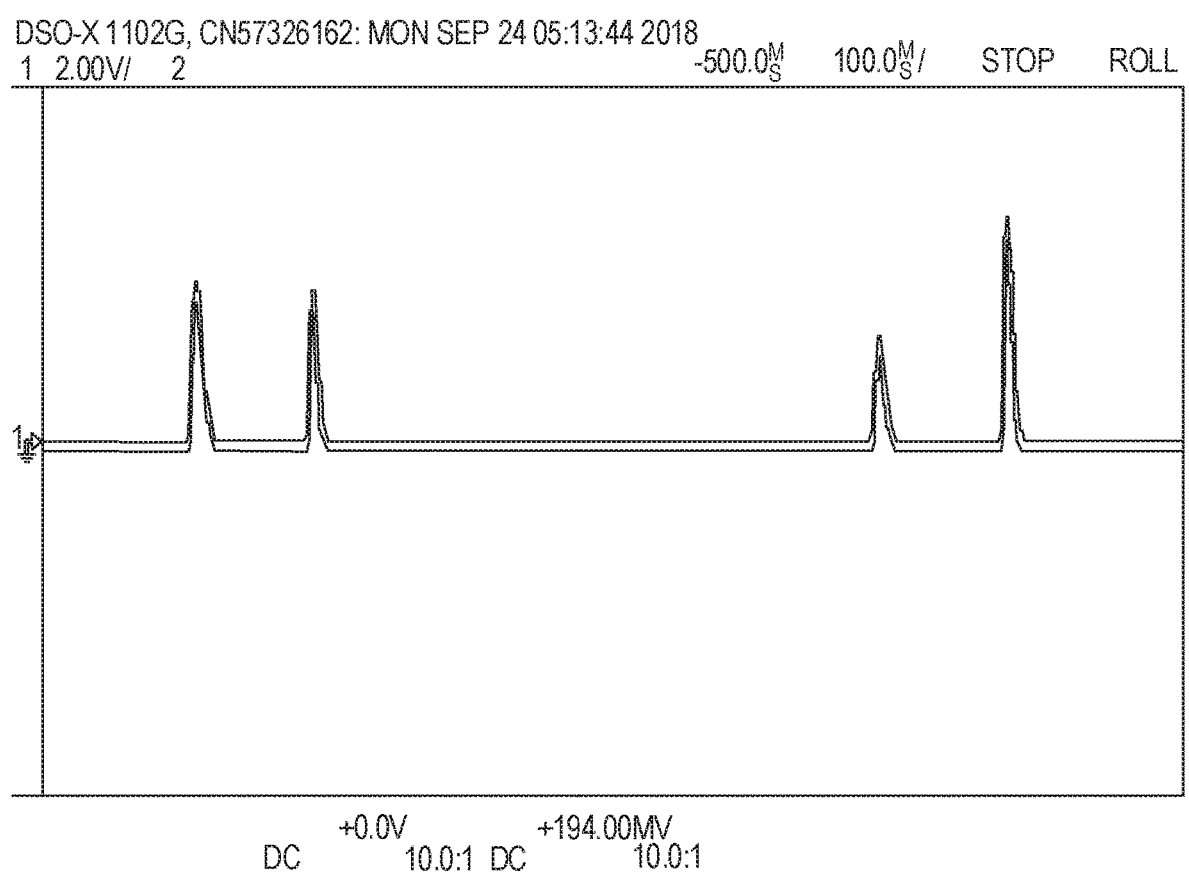
FIG. 10 shows an example of impulse responses from taps diagram.

FIG. 10 shows an example of impulse responses from taps diagram The first is an impulse response. When the piezo is subject to an impulse it produces a large voltage-spike with a very short restoration time in the negative region as shown in the various figures contained herein.

Figure 11:
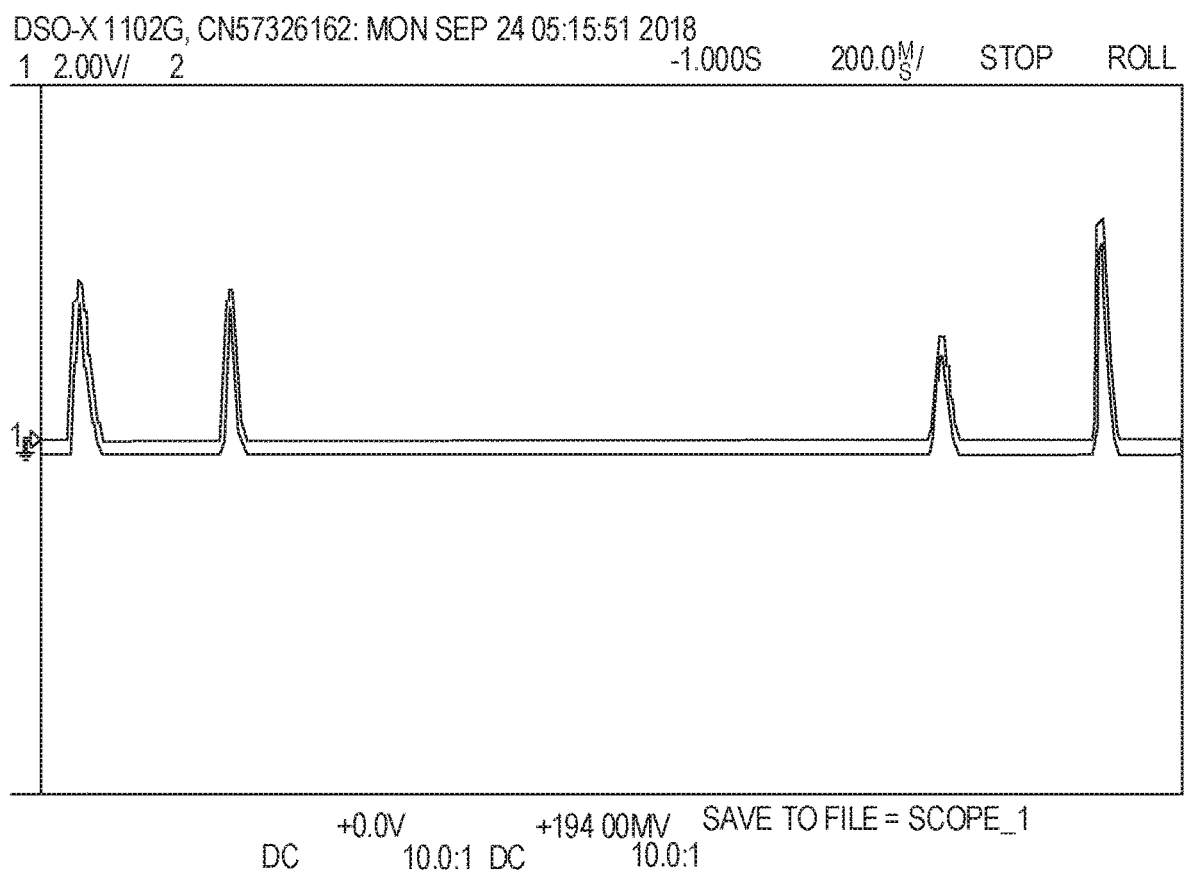
FIG. 11 shows an example of function-generated signals of taps diagram.

This works best when pressure is applied to the long axis as shown in FIG. 11. Pressure in the other two axes results in approximately one-tenth of the voltage output. For example, if the voltage out of the long axis is 3 V, then the same pressure to the piezo in the other two axes may be approximately 0.3 V.

The following sets of data were collected using a simulated piezo response due to tapping. The simulated signal is a reconstruction of the piezo without the negative response and none of the noise between impulses. The signal shown is set at 200 mHz (0.2 Hz) or to reoccur every 5 seconds. FIG. 11 shows the generated signal from the function Generator (FGEN) to be used as a consistent source to replicate a tapping response.

Figure 12:
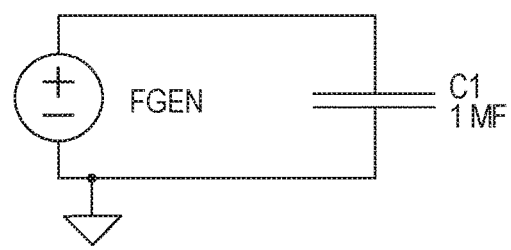
FIG. 12 shows an example of a high-level schematic diagram of a capacitor coupled to a function generator in accordance with various embodiments.

To begin power generation, the researchers used a capacitor to store the power. Using just a simple capacitor across the terminals of the function generator is shown in FIG. 12.

Figure 13:
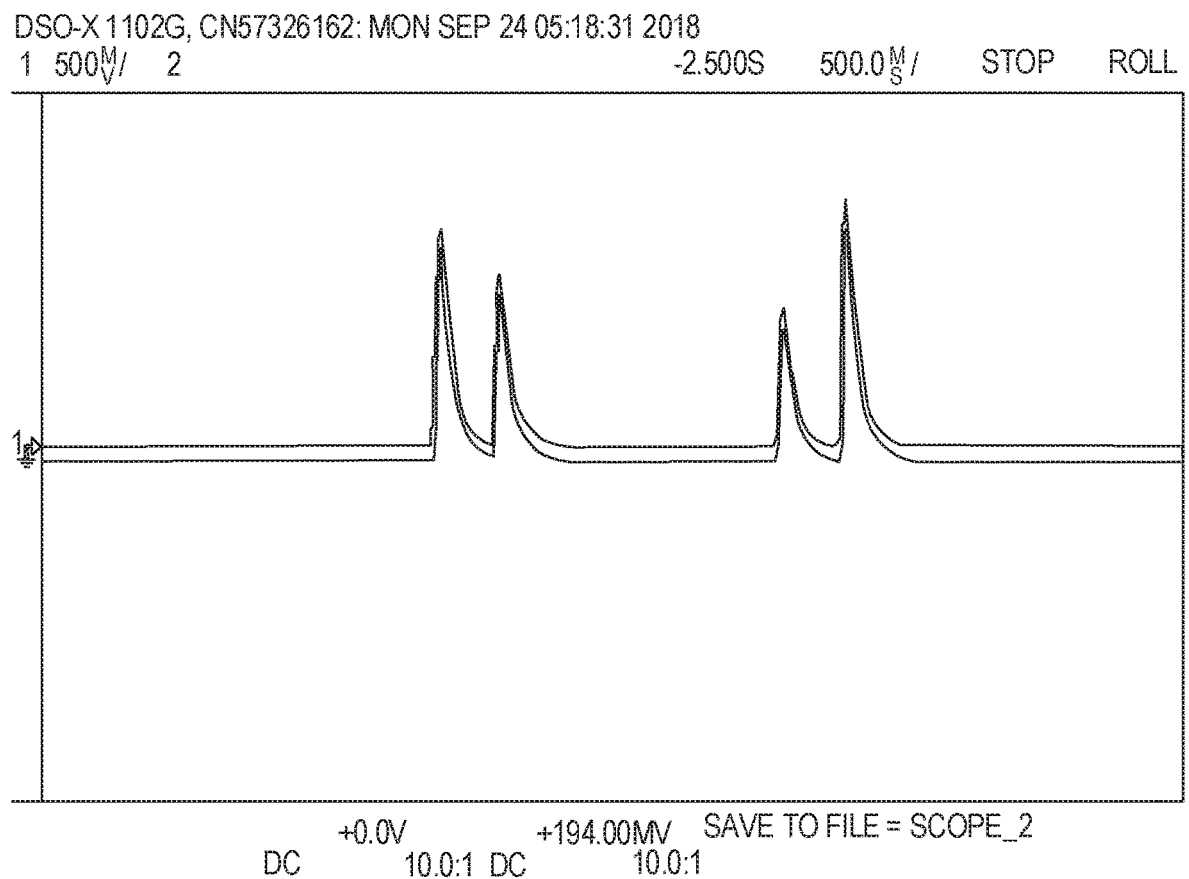
FIG. 13 shows an example of a capacitor response diagram.

FIG. 13 shows the result of attaching the capacitor across the output of the FGEN. Note that while the signal looks the same across the capacitor, it has dropped significantly. From a 5 V peak to a 1.4 V peak. Referring to the fourth spike of the signal, note that the capacitor is quickly charging up, and then discharging almost immediately. This difference accounts for the slightly different slope of the curve as it returns back to 0 V.

The period-of-time that it takes for the capacitor to discharge and charge can be controlled by a resistor. In fact, the dissipation part of the curve in FIG. 13 is different than that of FIG. 11; this is due to the internal resistance of the capacitor, or its equivalent series resistance (ESR). However, a resistor will also dissipate power from the system. To minimize losses, the researchers use an inductor in various embodiments instead of a resistor. First, to control the discharge time, and secondly, to filter the signal to be primarily DC.

Figure 14:
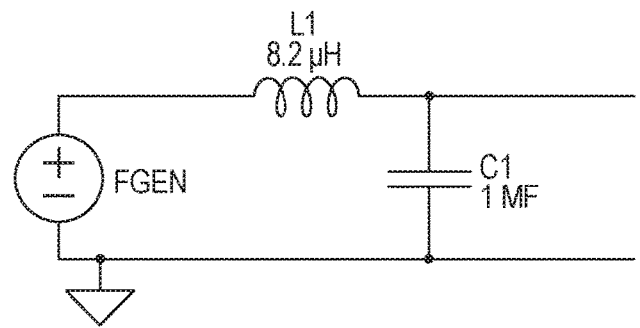
FIG. 14 shows an example of a high-level schematic diagram of an inductive-capacitive (LC) circuit in accordance with various embodiments.

FIG. 14 shows an example of a high-level schematic diagram of an inductive-capacitive (LC) circuit in accordance with various embodiments. Connecting an inductor in series with the capacitor acts as a low pass filter as shown below. In this exemplary embodiment, the −3 DB frequency of the circuit is $$f_{-3DB} = \frac{1}{2\pi\sqrt{LC}} = \frac{1}{2\pi\sqrt{(8.2\ \mu H)(1\ mF)}} = 1.76\ \text{kHz}.$$

Figure 15:
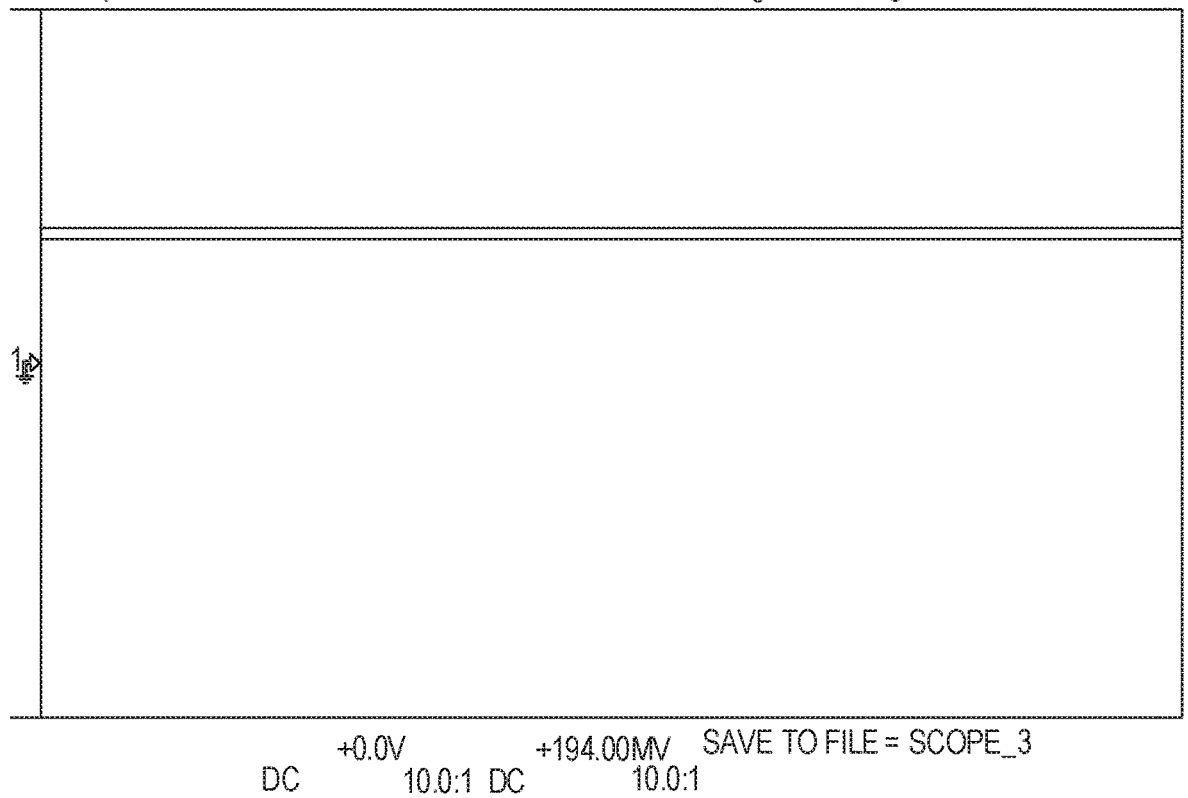
FIG. 15 shows an example of an LC-filtered signal diagram.

1.76 kHz. This will convert the response across the capacitor from an impulse to a constant voltage as shown in FIG. 15.

Figure 16:
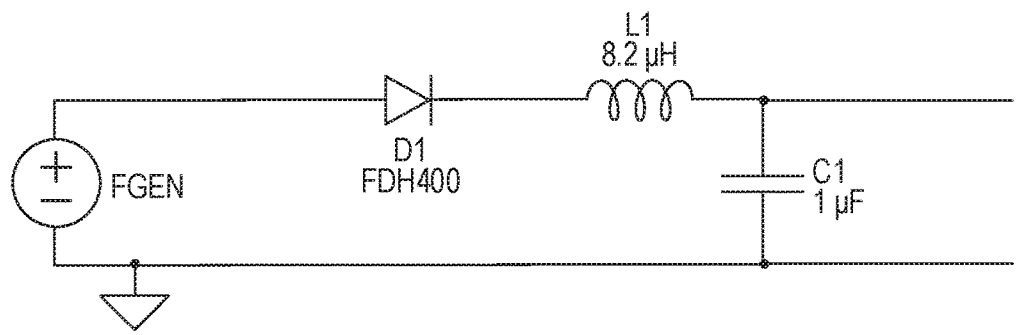
FIG. 16 shows an example of a diode added to the high-level schematic diagram of the LC circuit of FIG. 14 to prevent the capacitor from discharging, or reduce an amount of discharge, in accordance with various embodiments.
Figure 17:
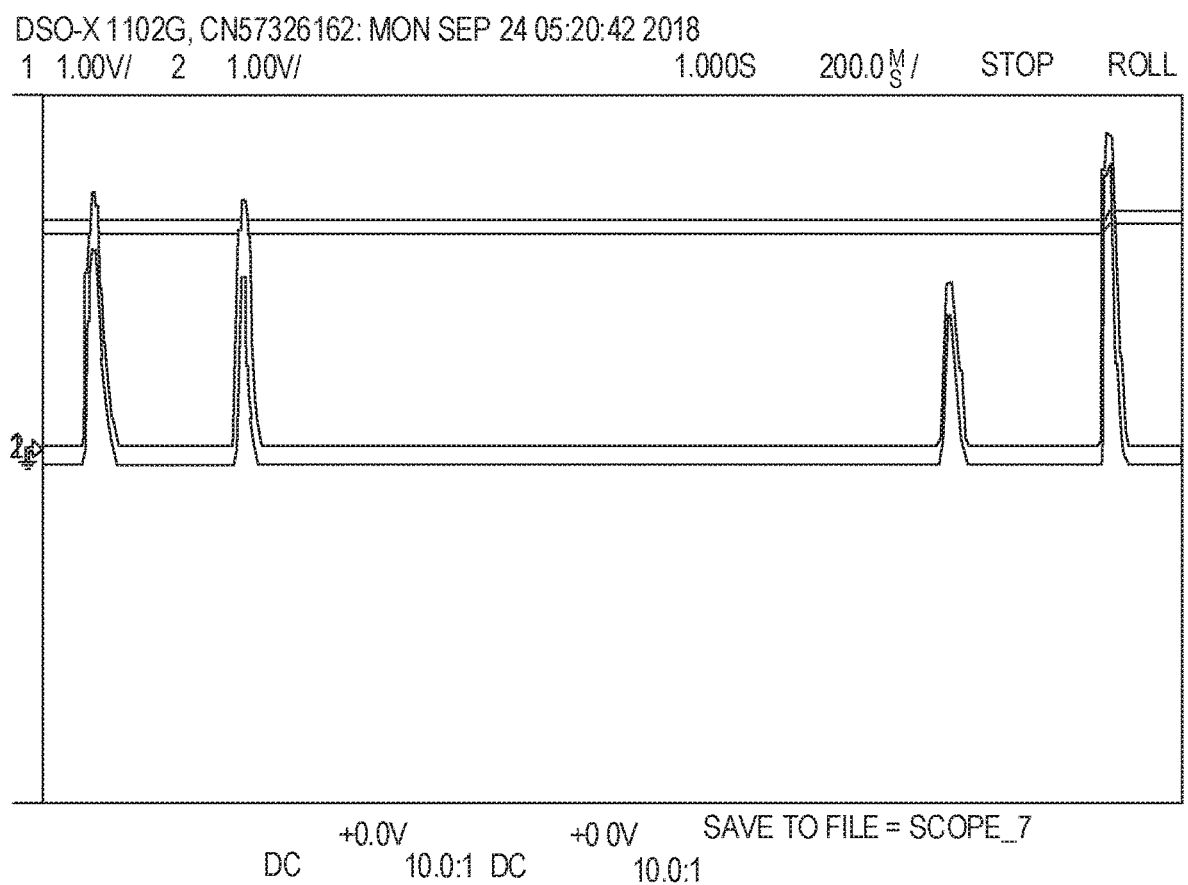
FIG. 17 shows an example of a capacitor-charging diagram.

To prevent the capacitor from discharging, a diode is added turning the circuit into a peak detector with a low pass filter as shown in FIG. 16. An example of a capacitor charging diagram (how the capacitor charges at each impulse) is shown in FIG. 17. The rate at which the capacitor charges is controlled by the time constant. The difference now is that the capacitor is being blocked by the diode from discharging back into the circuit. At each instant that a peak comes, the capacitor charges up a bit and the energy can be stored for later use due to the diode. The lower signal is the input signal and the upper signal is the voltage across the capacitor. Note that the voltage after about 40 seconds is up to 2.5 V, which is much better than the previous storage of 0.7 V without the diode. The width of the impulse is the charge time from the top signal entering the bottom impulse signal to the end of the bottom impulse signal.

With continuing reference to FIG. 17, the charge time of the first three curves at this point in time is much shorter than that of the fourth impulse that is wider. Zooming in on the first three impulse signals one will see the same step as that on the fourth curve. However, in the actual system as seen in the first two figures have a negative part to their response. To adjust for negative part, the researchers used a full bridge rectifier in various embodiments to force the signal to be positive. In other words, reducing the negative voltage and current into the system.

Figure 18:
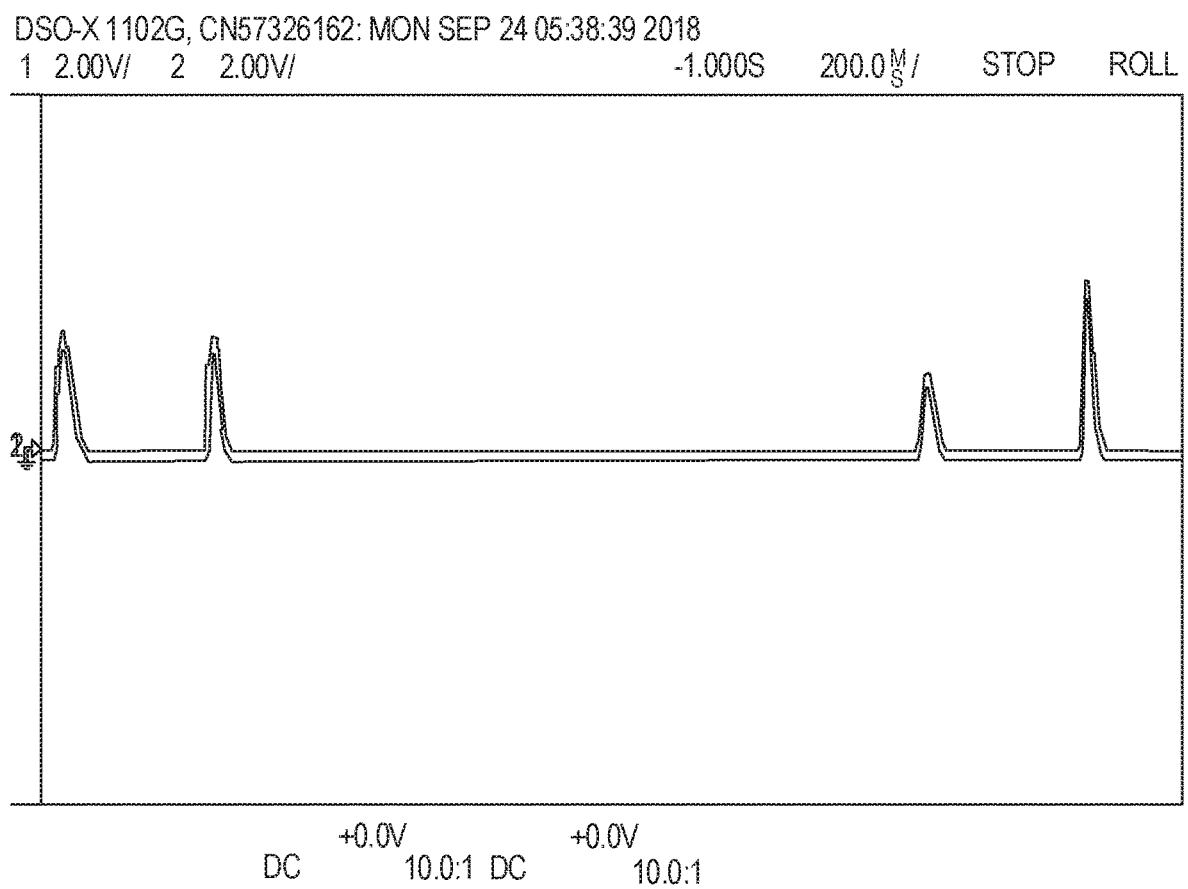
FIG. 18 shows an example of a rectified positive-voltage diagram in accordance with various embodiments.

FIG. 18 shows that there are minimal losses when using the full bridge rectifier on the strictly positive signal. While it appears in FIG. 18 that there is only one signal, there is in fact another input signal from the FGEN behind the output signal shown from the full bridge rectifier. The circuit of FIG. 19 can be used for all further loads that will be tested with the circuit. Note that the full bridge rectifier being used is made entirely out of, for example, FDH400 diodes (known to a person of ordinary skill in the art) and retains the same properties as the peak detector.

Figure 19:
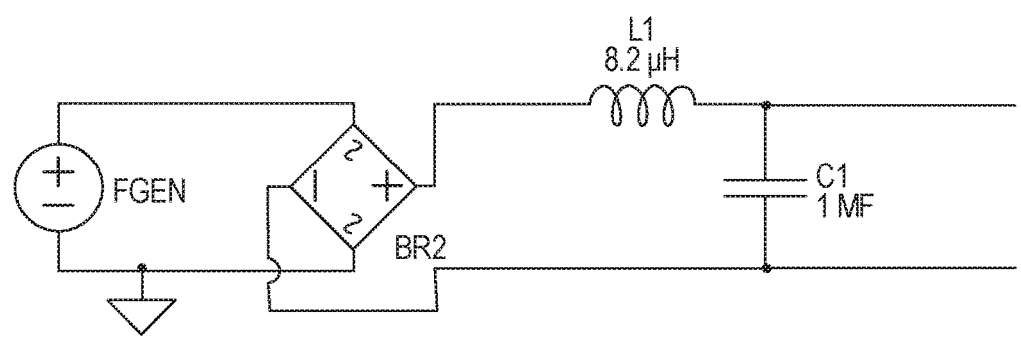
FIG. 19 shows an example of a power-electronic circuit in accordance with various embodiments.
Figure 20:
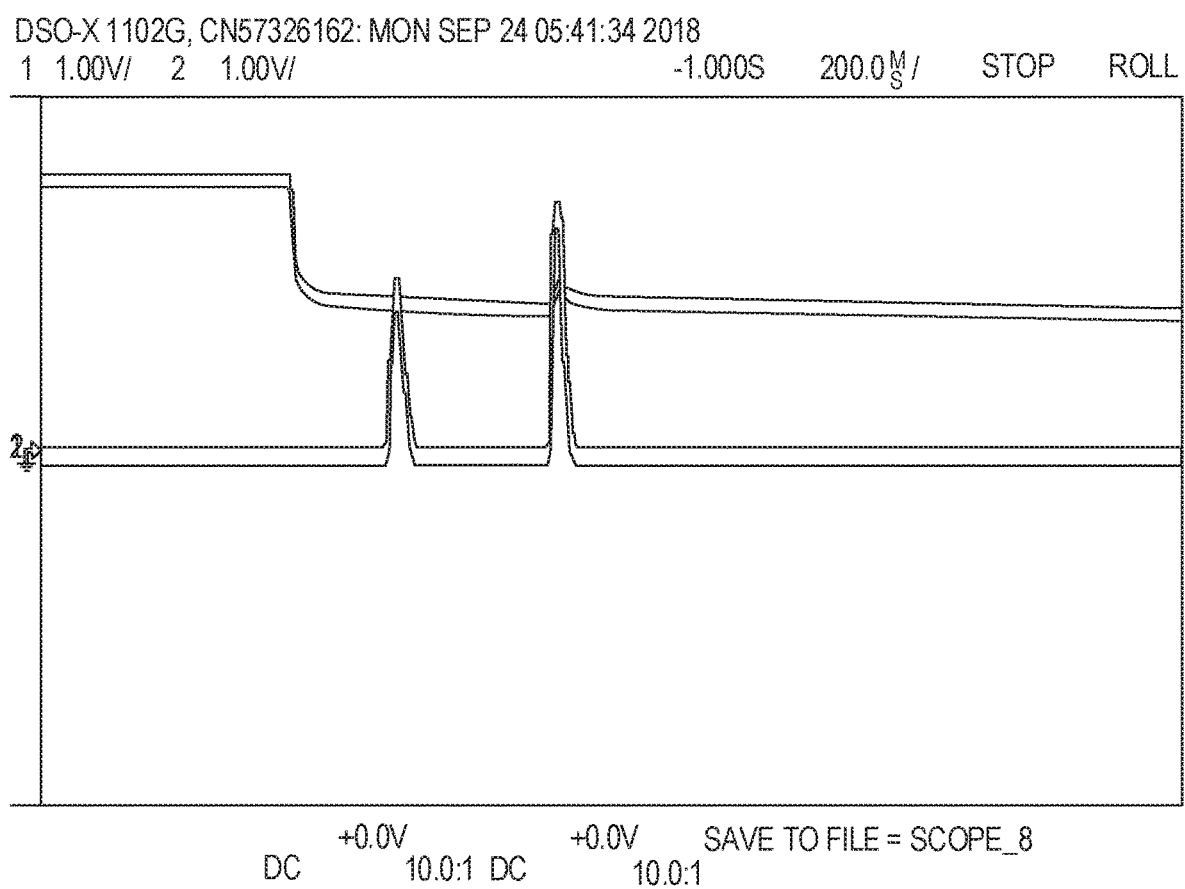
FIG. 20 shows an example of an output of a full-bridge circuit with LC filter circuit diagram.
Figure 21:
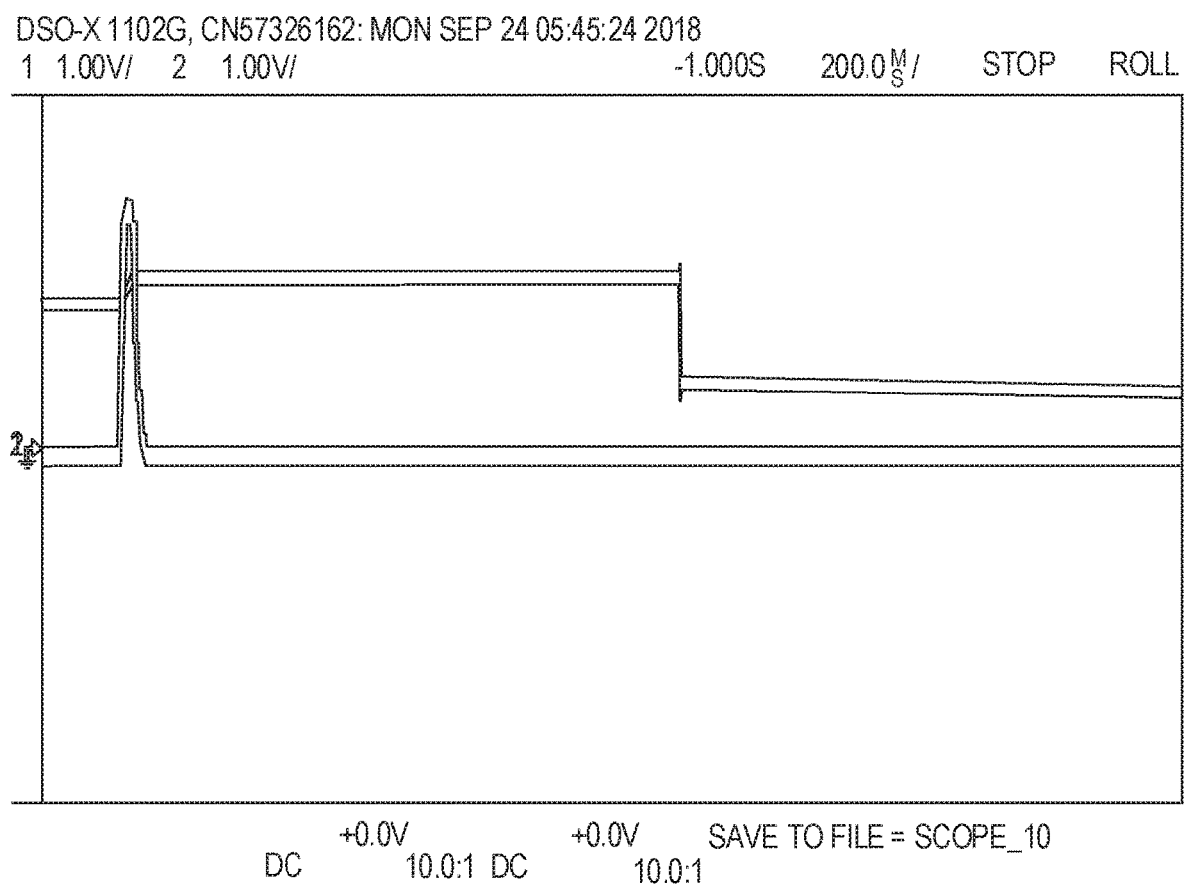
FIG. 21 shows an example of an inverter attached to a circuit voltage-response diagram.
Figure 22:
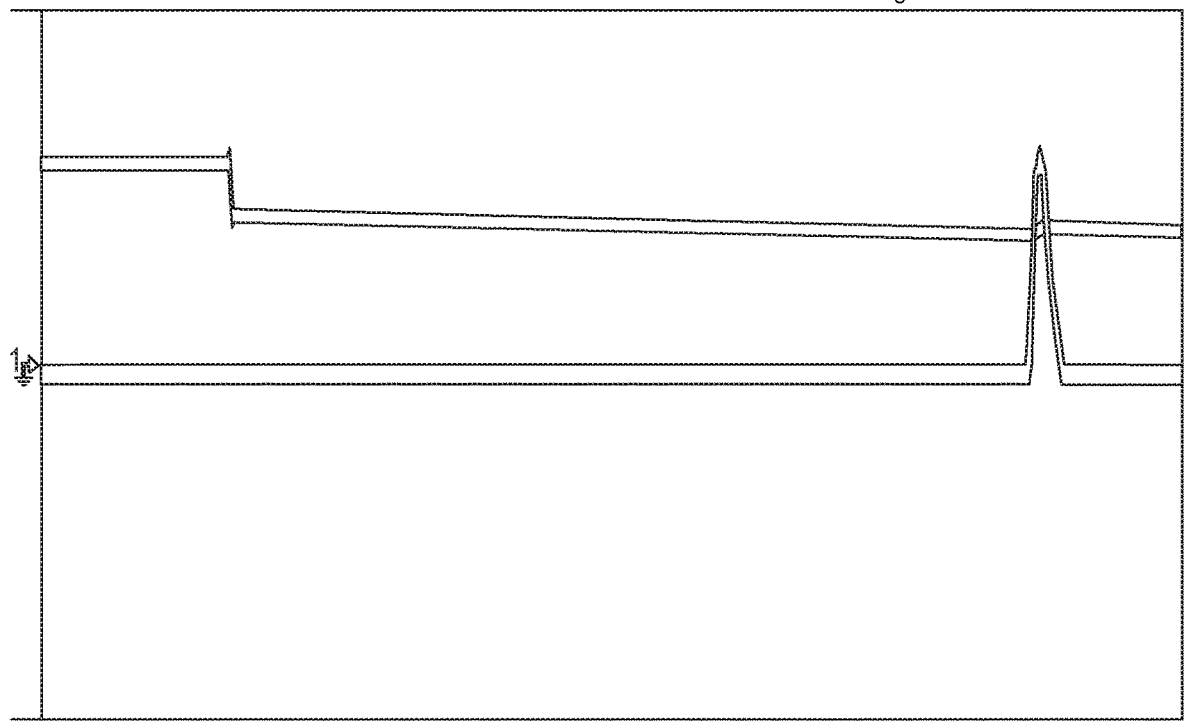
FIG. 22 shows an example of a boost converter attached to a circuit voltage-response diagram.

Plugging in an LED into the circuit of FIG. 19, it immediately lighted up very brightly as the capacitor discharged into the LED, but then the system stayed at the turn-on voltage of the LED. This condition refers to the steady state of the systems discussed below. Each of the following impulses corresponded to a flash of light from the LED which indicates that there is indeed power being transferred from the capacitor to the LED at each impulse. FIG. 20 shows an example of an output of a full bridge circuit with LC filter circuit diagram FIGS. 21 and 22 show the results of attaching a boost converter and an inverter as the load; both of which have the property that they drop to a lower voltage and then discharge any extra voltage that goes into them at each impulse. Note again that the width of the impulse corresponds to the charging-up time of the capacitor before it gets discharged into the invertor or boost converter. The inverter dissipates energy from the capacitor until it is at approximately 0.8 V and the boost converter dissipates to about 1.8 V. Both the inverter and boost converter are far below their turn-on voltages of about 12 V and about 3 V, respectively. The idea is to use the boost converter to up the voltage from the storage circuit to the expected voltage of the inverter.

Figure 23:
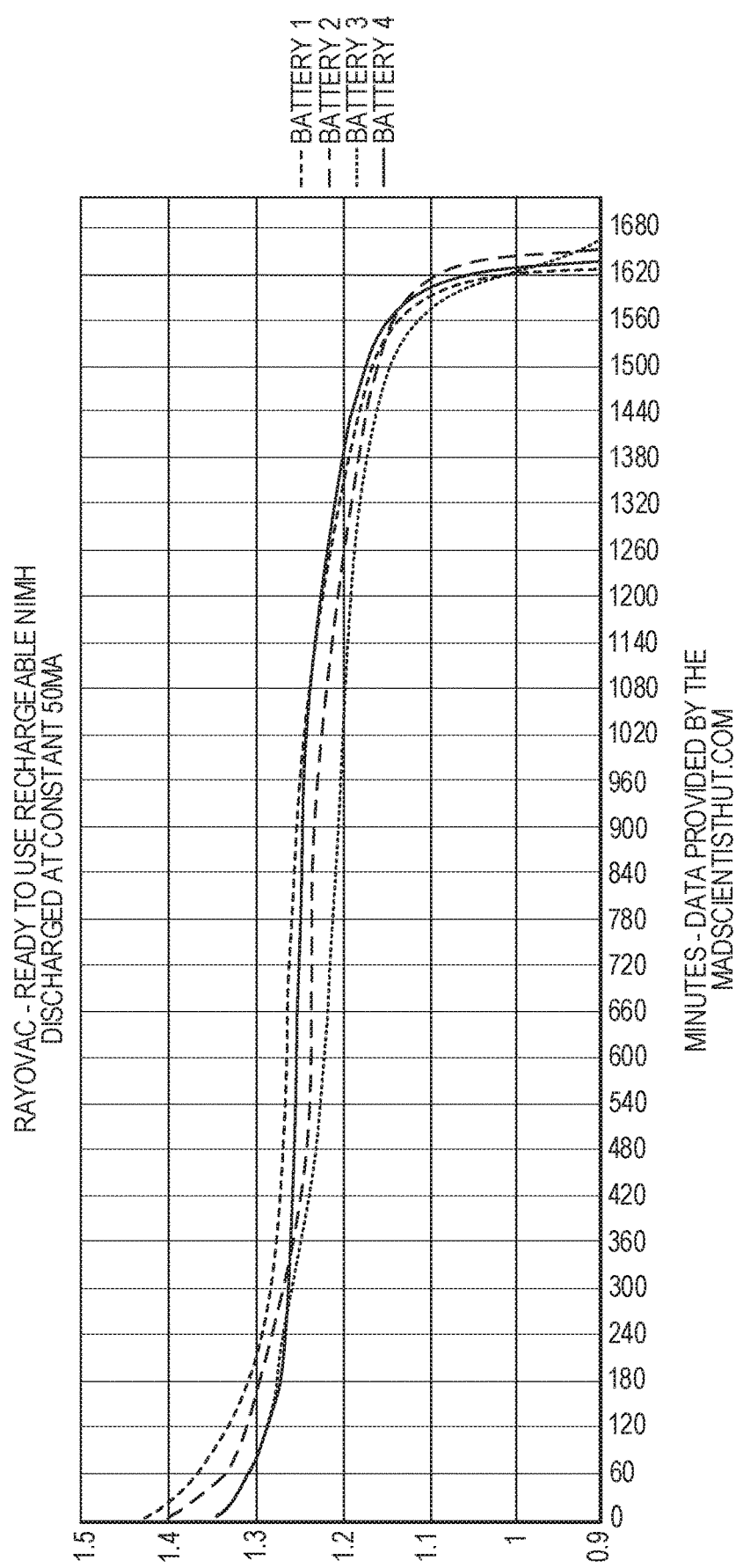
FIG. 23 shows an example of commercially-available battery discharge curves.

To account for the exponential discharge of a capacitor, the researchers used a rechargeable battery that can charge at each impulse from the circuit, and supply energy to a system from the battery. Improving the charging ability of the circuit to the battery allows the system to be self-sustaining and last longer than just the battery operating alone. FIG. 23 shows an example of commercially-available battery discharge curves (voltage as a function of time); the dissipation curve for a standard AA battery is of the form shown. To measure the capacity of energy left in the battery, the integral is used. However, given that the voltage is nearly constant for the majority of the discharge curves, a drained battery was used to test if the system would actually charge the battery.

The rechargeable battery started at approximately 900 mV, which is close to the rapid drop-off point of the dissipation curve. Around approximately 600 mV is when a rechargeable battery is usually considered dead, and it is difficult to charge at this point. By selecting a mostly discharged battery, the charging can be seen more easily in terms of the voltage across the battery increasing back to its nominal voltage. In the case of the AA battery, the nominal voltage is around 1.25V. Charging the battery in the middle of the discharge curve would be harder to measure if this proof-of-concept test is working. After about 2.5 hours of having the battery hooked up to the circuit shown, the battery had charged up to a voltage of approximately 1.12 V, which is a considerable amount up the curve to definitively say that the battery was indeed being charged.

Table II shows the data collected throughout the 2.5 hours of charging (measured voltage as a function of charging time). Note that the initial jump in the voltage measured only seems larger since the discharge is steeper at the 900 mV point of the discharge curve. It does not correspond to faster charging.

TABLE II

| Time | Voltage Measured |
|---|---|
| 0 | 900 mV |
| 30 min | 1.00 V |
| 1 hour | 1.02 V |
| 2 hours | 1.09 V |
| 2.25 hours | 1.10 V |
| 2.50 hours | 1.12 V |

Figure 24:
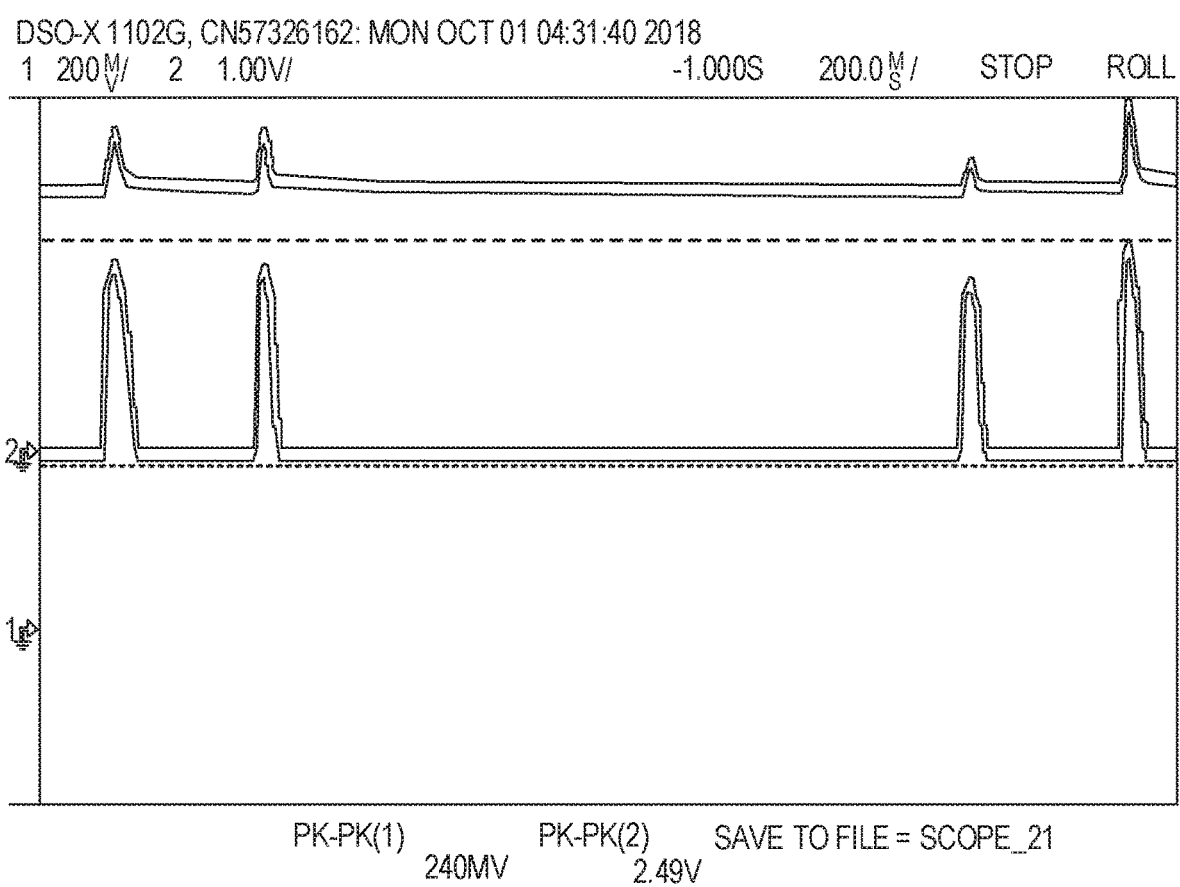
FIGS. 24 and 25 show examples of battery-charging response diagrams.

FIG. 24 shows the voltage measured by an oscilloscope across the battery during the charging process. The peaks correspond to each of the simulated impulses at the input. The area between the flat part of the curve and the bump is the capacity being stored into the battery at each pulse. The lower curve is a distorted input curve (simulated piezoelectric voltage output) and the upper curve is the voltage measured across the battery. The battery is in parallel with the capacitor as shown and discussed with reference to FIG. 30, below.

Figure 25:
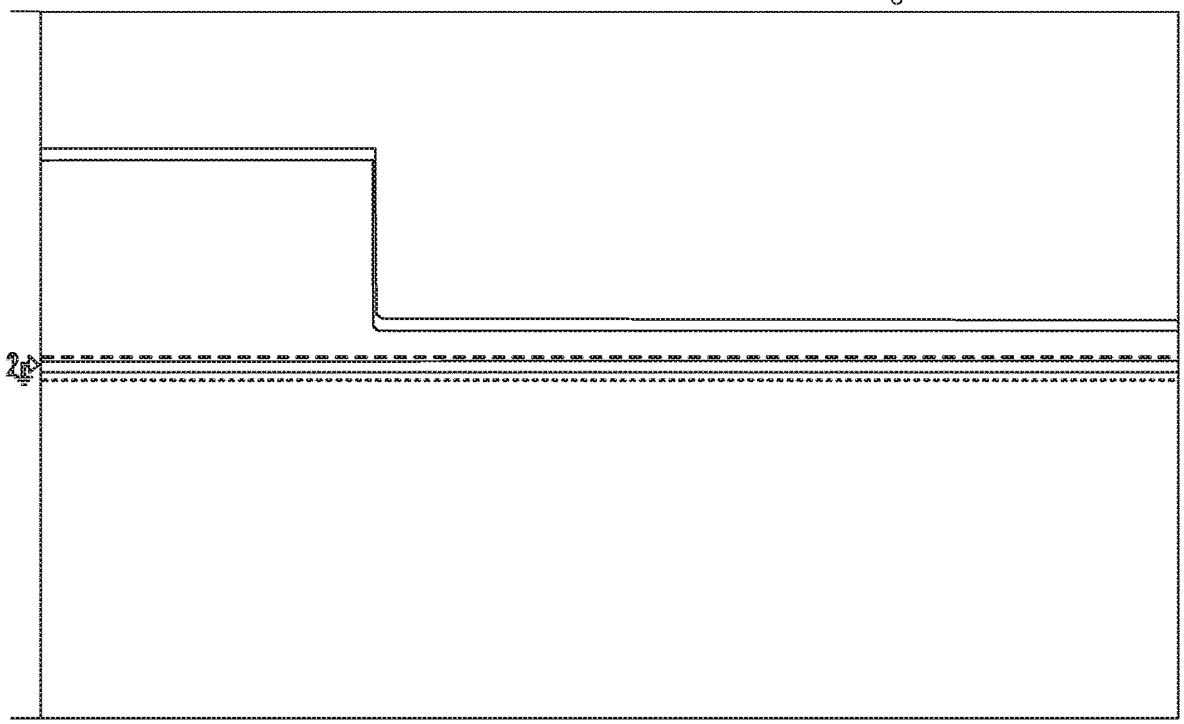

In order for the battery to be charged, the capacitor should initially be charged to at least the voltage of the battery; otherwise, the battery will supply the charging circuit instead. However, this is only a problem if the battery is close to being severely depleted. The capacitor should end up being charged up to the approximately the voltage of the battery by the battery, and then be able to supply energy back to the battery from the piezo. FIG. 25 shows the result of plugging the battery into the circuit after the capacitor has been charged up to about 5 V.

Note that the capacitor immediately discharged into the battery, and since the capacitor and the battery are in parallel, they must have the same voltage.

Figure 26:
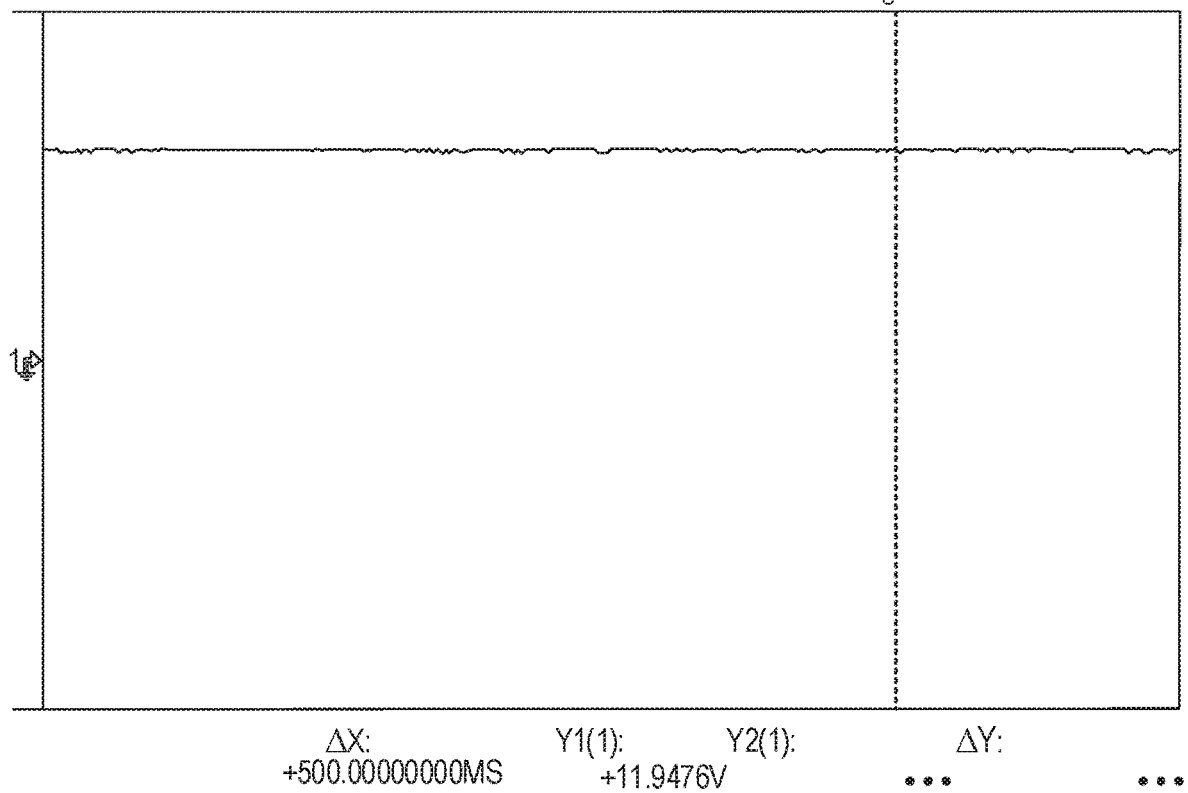
FIG. 26 shows an example of a battery boosted diagram.

Now that a steady power supply is achieved, a boost converter can be used to get the voltage up to the level used for the inverter (approximately 12 V in this example). The boost converter being used (in this specific exemplary embodiment, a XL6009 device, available from numerous sources worldwide) can use a minimum input voltage of approximately 3 V to begin working properly. To meet this minimum input voltage, rather than using one AA rechargeable battery, three AA rechargeable batteries can be used, which yields an output voltage of about 3.75 V. FIG. 26 shows the output of the boost converter into the inverter from the battery while the battery is not hooked up to the charging circuit.

Figure 27:
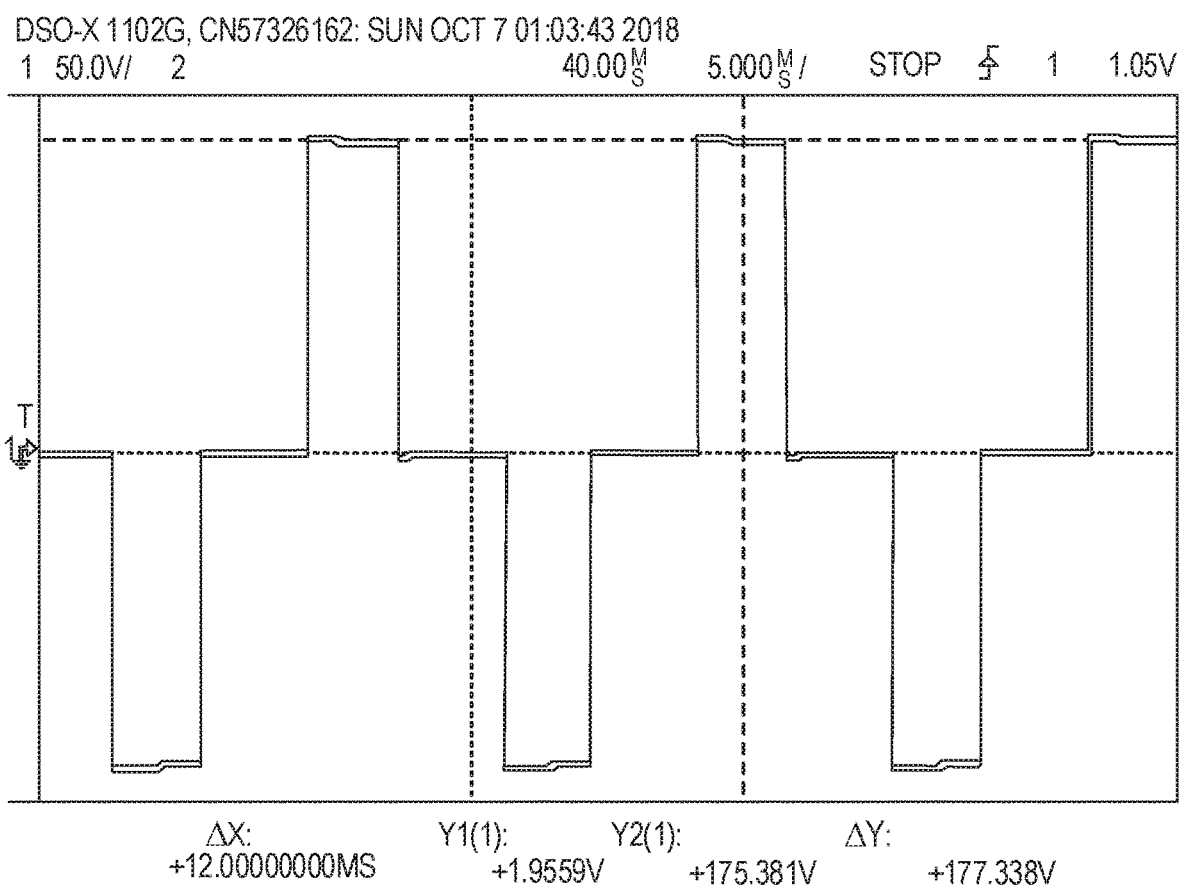
FIG. 27 shows an example of an output from the inverter due to the input out of the boost converter.
Figure 28:
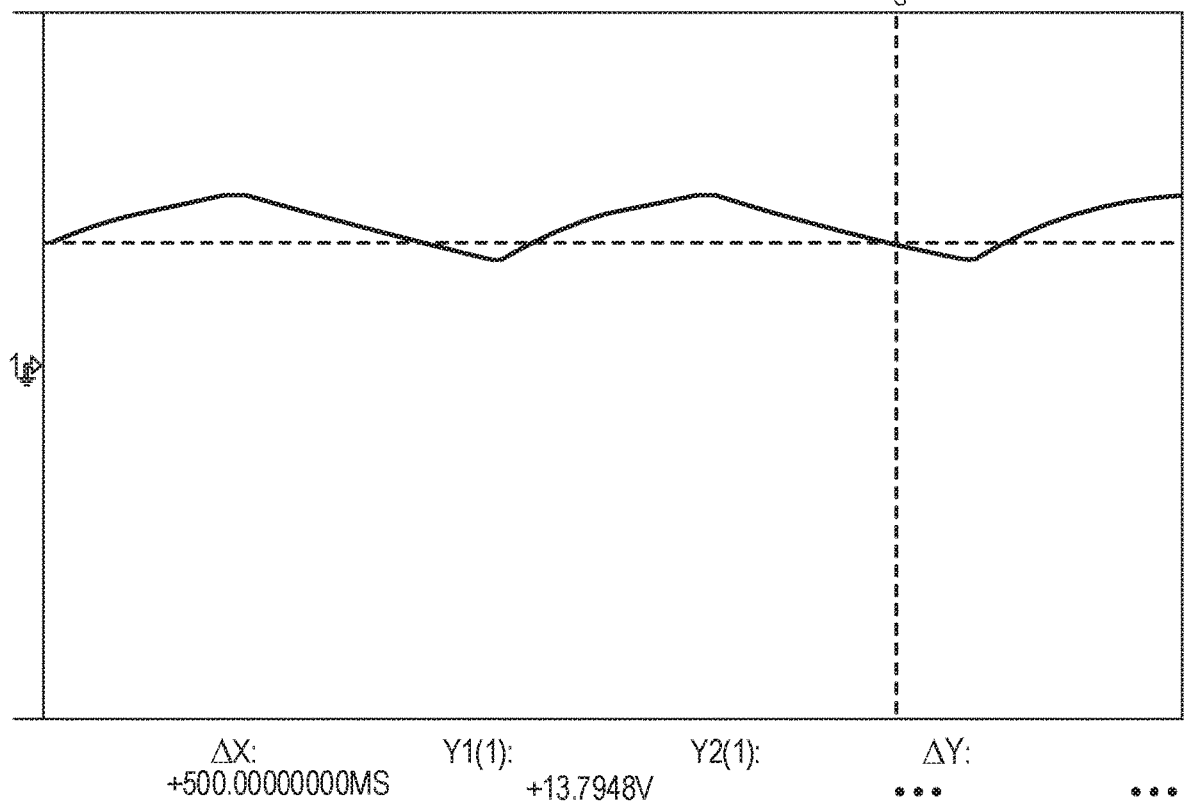
FIG. 28 shows an example of an oscillatory behavior of the boost converter.
Figure 29:
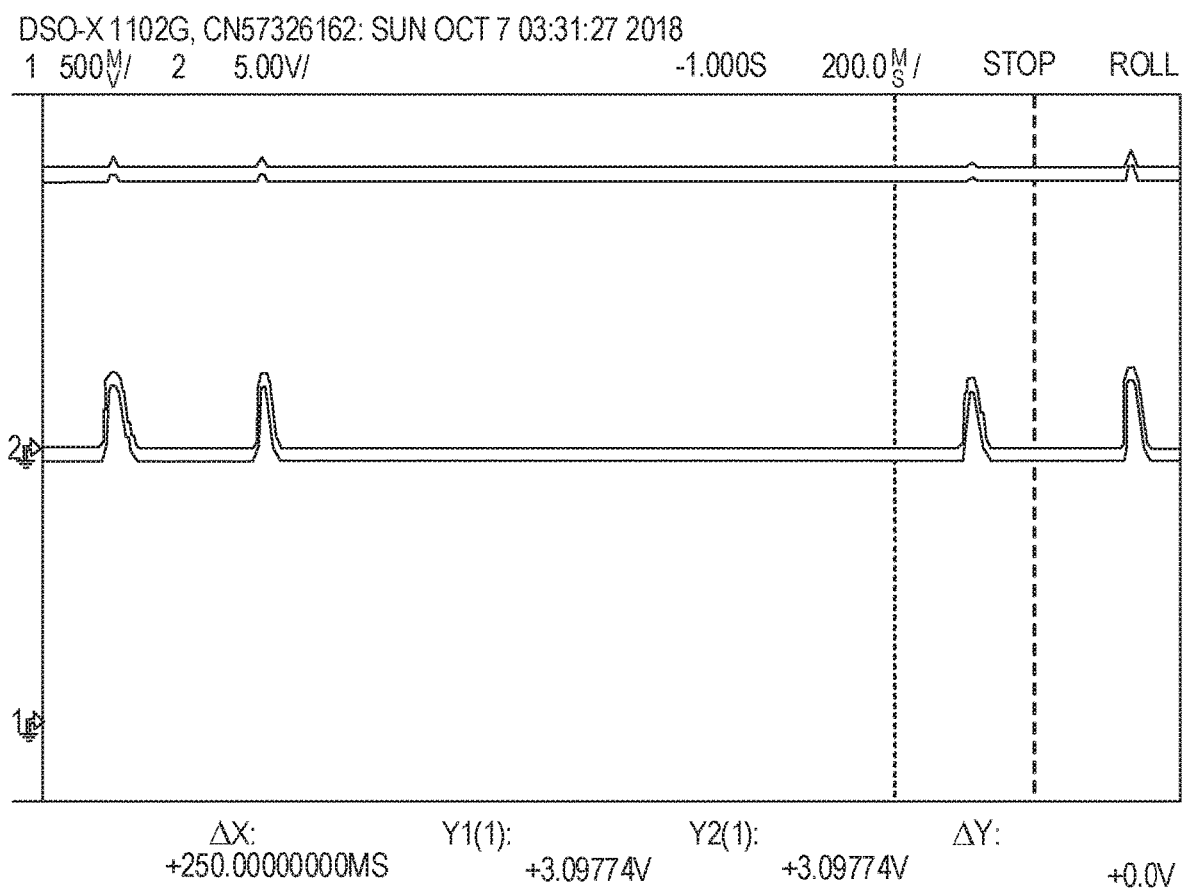
FIG. 29 shows an example of charging three AA batteries.
Figure 30:
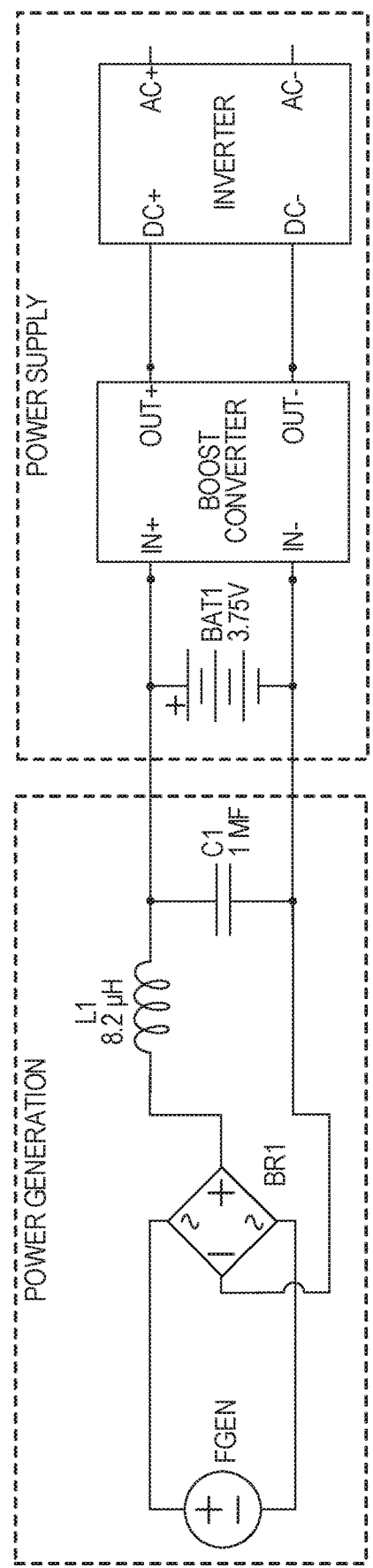
FIGS. 30 and 31 show examples of a high-level schematic diagrams in accordance with various embodiments of the disclosed subject matter.

FIG. 27 shows the output from the inverter due to the input produced out of the boost converter. The square AC response can be used to power a multitude of devices since the power inverter being used can be fitted with a standard three-terminal wall output. Each time the voltage at the input of the inverter drops into the range below about 11.7 V, the inverter ends up entering its built-in cutoff mode and does not output the desired signal. The system was stable with everything plugged in, but the moment a phone charger was attached to the output of the inverter, an oscillatory behavior was observed. FIG. 28 shows an example of the oscillatory behavior of the boost converter. FIG. 30 shows the full circuit up to this point. Essentially there are two stages, a power generation stage, and a power supply stage. The transition from power being generated to power being supplied is the section of the circuit where power is being stored.

In a specific exemplary embodiment, to prevent the pulse in the battery from causing the boost converter to yield an unstable output. To add further filtering capability, a Darlington combination could be added to the filter reducing the 3 dB point may be $\beta1\beta2$.

Figure 31:
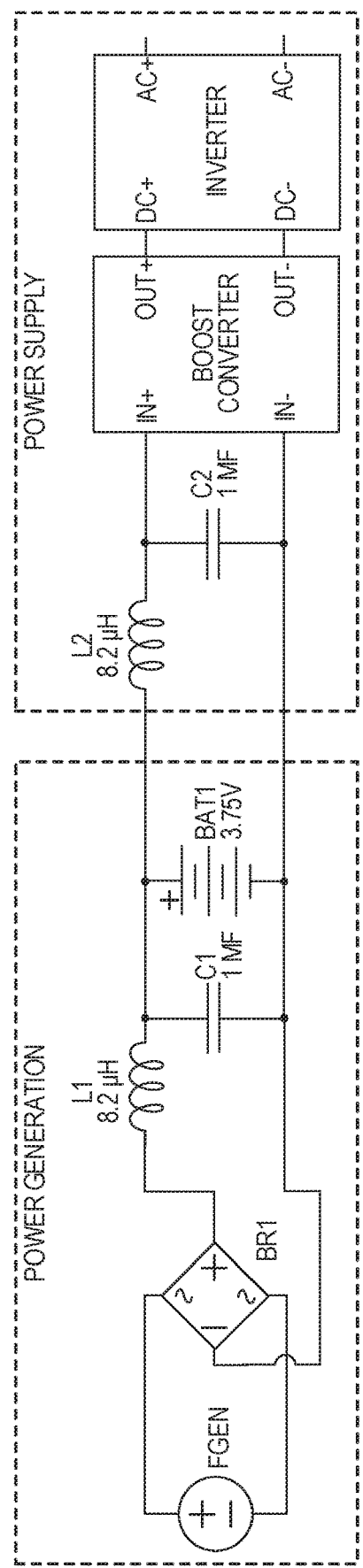
Figure 32:
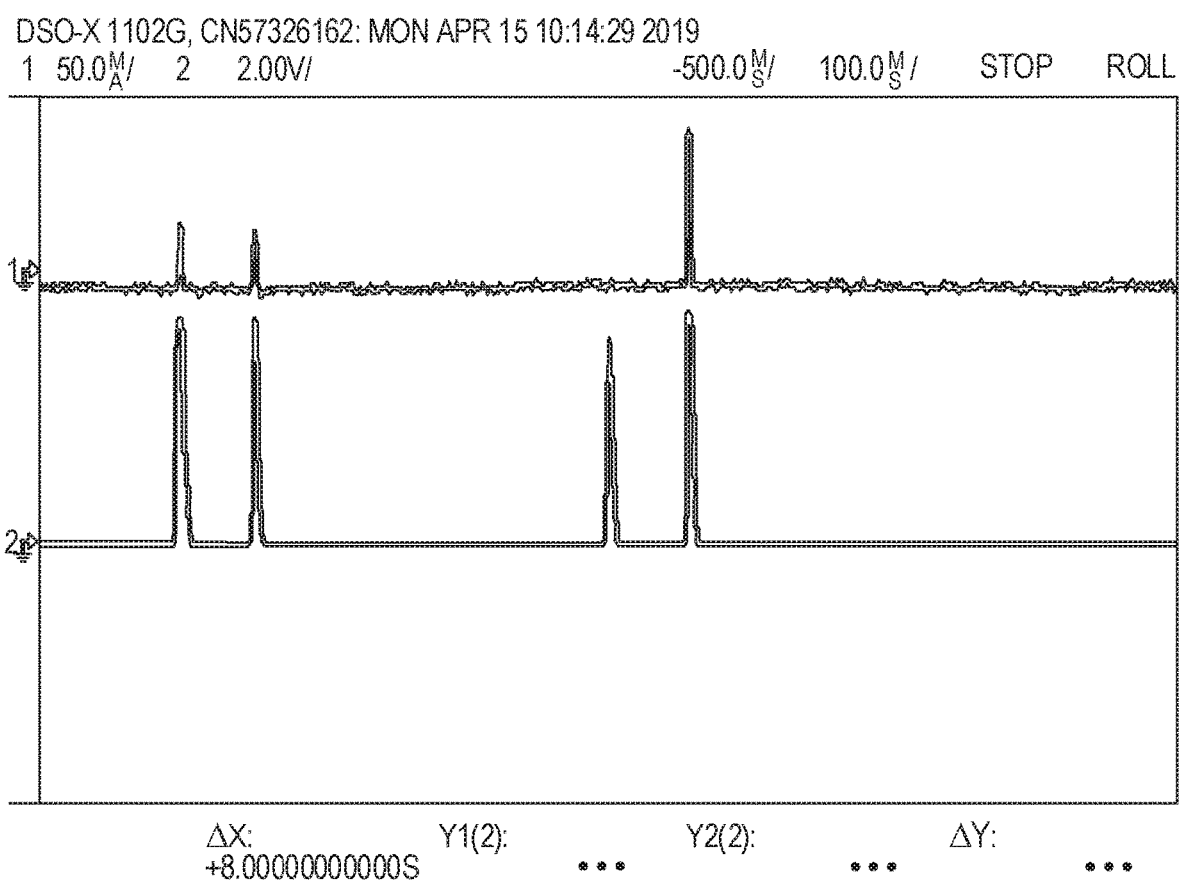
FIG. 32 shows an example of voltage pulses generated (lower curve) and current pulses (upper curve) associated with various tests using a piezoelectric device described herein.
Figure 33:
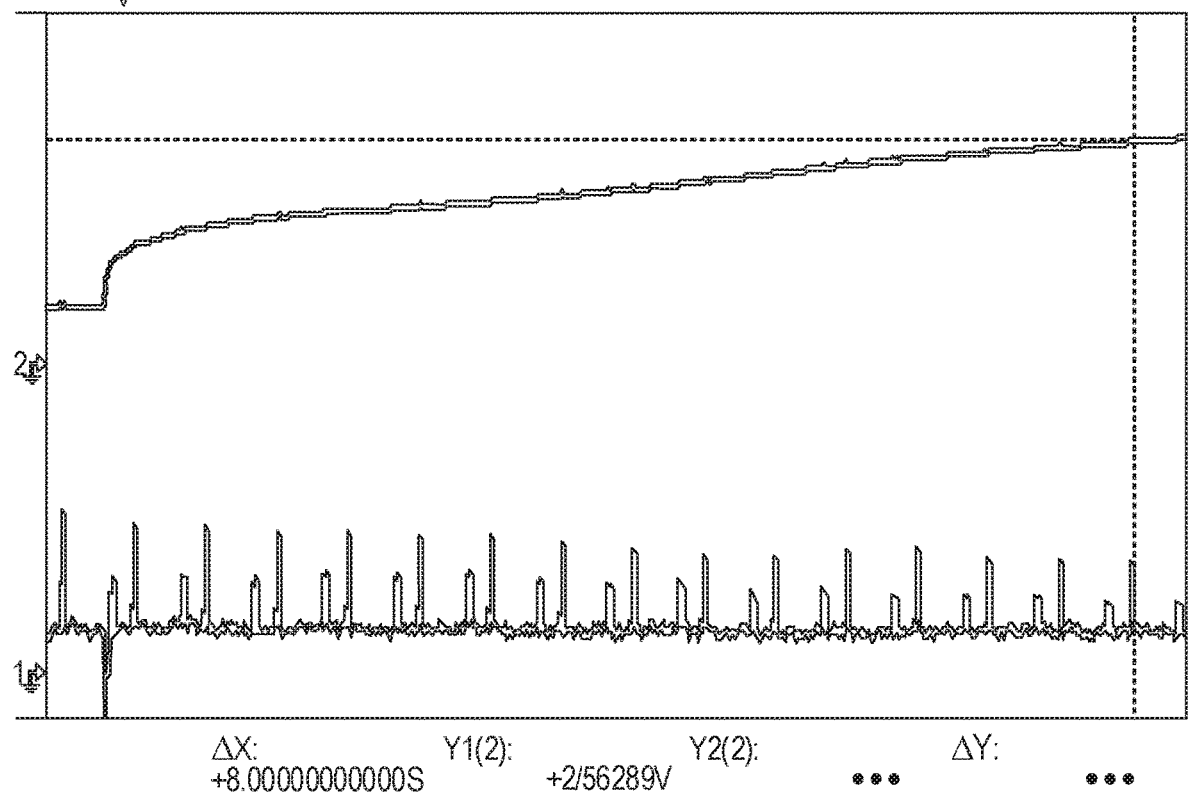
FIG. 33 shows a charging process of the circuit with pulses applied to the piezoelectric device.

FIG. 32 shows an example of voltage pulses generated (lower curve) and current pulses (upper curve) associated with various tests using a piezoelectric device described herein. In order to expand the idea of energy harvested from the stressed piezoelectric material, described above, a stack of piezoelectric may be equipped with power electronic devices. A set of piezoelectric devices are formed and generated various current and voltage pulses described herein. A frequency of pulses, in various embodiments, may be set to 10 Hz. The power electronic devices used for energy harvesting comprises a full bridge DC converter to take away the negative parts of the voltage appeared in FIG. 32. Next, the pulses are smoothened out by a low pass filter including a series inductor and a shunt capacitor. The circuit is sized for a small application of 5V, 5 W application. The inductor L is 8.6 µH, the capacitor C is two parallel 1.0 mF. As described above, FIG. 31 shows a schematic diagram of the circuit set up to charge the battery and power up the inverter. FIG. 33 shows a charging process of the circuit with the pulses applied to the piezoelectric device.

In order to hold the electric charge on the capacitor, a battery is attached to the circuit in parallel with the capacitor. A set of rechargeable battery self-sustains the circuit. The dissipation curve for a standard AA battery is of the form as described with reference to FIG. 23, above. As shown in FIG. 23, it is preferable to work in the linear region of the battery. If the battery gets discharged too deeply, bringing it back to life would take a significant increase in electric energy.

The circuit is set to supply a set of 1.5 W, 3.6 V incandescent lamps. The test was run for 5 hours successfully without the battery being discharged. As noted above, FIG. 28 shows DC voltage being boosted by a DC-DC converter. This converter is going to be used for maximum power point tracking also. FIG. 27 shows the AC signal at the output of a small single-phase inverter.

Therefore, disclosed herein is a multidisciplinary system approach to investigate the energy recovery potential of dual-mode piezoelectric generators to create roadway piezoelectric energy harvesting systems with ultra-high-power density and efficiency such that over 50% of the mechanical energy can be harvested as electricity. The exemplary piezoelectric energy harvesting system is designed to achieve an electrical energy density of 333 W/ft$^2$ with the cost reduced to $9,010/kW and a lifetime of up to 20 years. One goal of this project is to demonstrate in the laboratory the ultra-high-capacity of electric power generation and feasibility to implement a large-scale demonstration on highways and streets with piezoelectric under-pavement and show that the proposed system will meet or exceed all expected specifications.

The subject matter described herein discloses various examples of proprietary methods and designs of piezoelectric energy-harvesting devices. The harvesting devices are utilized with and harvest energy from, for example, highway traffic and system integration technologies. However, upon reading and understanding the disclosure provided herein, a person of ordinary skill in the art will recognize that the disclosed subject matter can function well in other high-traffic environments, such as airport runways and the like. The following numbered examples encompass some of the embodiments of the disclosed subject matter in accordance with the accompanying figures and the associated text Example 1: An energy-harvester power-unit, comprising: a structural block having a first face and an opposing second face that is substantially parallel to the first face, the structural block having a cavity formed therethrough; a first contactor arm mechanically coupled to the first face of the structural block and a second contactor arm mechanically coupled the second face of the structural block on a first end of each of the respective contactor arms, each of the contactor arms spanning over at least a portion of the cavity; a force-contact bar mechanically coupled to each of the contactor arms at a second end of the respective contactor arm, the force-contact bars positioned to be substantially over the cavity; a first elastic beam mechanically coupled substantially parallel to the first face and a second elastic beam mechanically coupled substantially parallel to the second face, both of the elastic beams positioned substantially over the cavity of the structural block; the elastic beams being mechanically coupled to respective ones of the contactor arms; and a piezoelectric element positioned within the cavity and mechanically coupled to the structural block, a longitudinal axis of the piezoelectric element being substantially perpendicular to a longitudinal axis of the force-contact bars.

Example 2: The energy-harvester power-unit of Example 1, wherein the piezoelectric element comprises at least one layer of lead zirconate titanate ($PbZr_xTi_{1-x}O_3$, PZT).

Example 3: The energy-harvester power-unit of either Example 1 or Example 2, wherein the piezoelectric element is configured to convert a compressive load transferred along the longitudinal axis of the piezoelectric element from a transmitted force received by the energy-harvester power-unit into an electrical output.

Example 4: The energy-harvester power-unit of any one of the previous Examples, further comprising an electrical circuit to boost the electrical output into a power signal and save at least a portion of the power signal to an energy-storage device, the electrical circuit comprising: a full-wave bridge rectifier and a filter electrically coupled to the electrical output: and a boost converter electrically coupled to the full-wave bridge rectifier and the filter to increase a voltage level of the electrical output, the boost converter coupled to an inverter to convert a direct current (DC) output of the boost converter into an alternating current (AC) signal.

Example 5: An energy-harvester power-unit, comprising: a piezoelectric-element structure having a first face and an opposing second face that is substantially parallel to the first face, the piezoelectric-element structure having a cavity formed therethrough from the first face to the second face and configured to hold a piezoelectric element, the cavity being located substantially in a centermost portion of the piezoelectric-element structure, the piezoelectric-element structure further having a plurality of additional openings formed therethrough from the first face to the second face that are distal to the cavity and substantially equally-spaced proximate to a periphery of the piezoelectric-element structure, each of the plurality of additional openings having conically-shaped elements formed thereon on the first face and the second face of the piezoelectric-element structure; a first elastic beam and a second elastic beam mechanically coupled substantially parallel to each of the first face and the second face, respectively, and spanning across the cavity of the piezoelectric-element structure; and a pair of conically-shaped compression elements configured to be matingly coupled to each of the plurality of additional openings.

Example 6: The energy-harvester power-unit of Example 5, further comprising a force-contact bar mechanically coupled to outer faces of each of the elastic beams.

Example 7: The energy-harvester power-unit of either Example 5 or Example 6, further comprising a piezoelectric element mounted within the cavity of the piezoelectric-element structure.

Example 8: The energy-harvester power-unit of Example 7, wherein the piezoelectric element comprises at least one layer of lead zirconate titanate ($PbZr_xTi_{1-x}O_3$, PZT).

Example 9: The energy-harvester power-unit of Example 7 or Example 8, wherein the piezoelectric element is configured to convert a compressive load transferred along a longitudinal axis of the piezoelectric element from a transmitted force received by the energy-harvester power-unit into an electrical output.

Example 10: The energy-harvester power-unit of any one of Example 5 through Example 8, further comprising an electrical circuit to boost the electrical output into a power signal and save at least a portion of the power signal to an energy-storage device, the electrical circuit comprising: a full-wave bridge rectifier and a filter electrically coupled to the electrical output; and a boost converter electrically coupled to the full-wave bridge rectifier and the filter to increase a voltage level of the electrical output, the boost converter coupled to an inverter to convert a direct current (DC) output of the boost converter into an alternating current (AC) signal.

Example 11: A power-harvesting device tower, comprising a plurality of energy-harvester power-units, each of the plurality of energy-harvester power-units including: a structural block having a first face and an opposing second face that is substantially parallel to the first face, the structural block having a cavity formed therethrough from the first face to the second face; a first elastic beam and a second elastic beam each mechanically coupled substantially parallel to each of the first face and the second face, respectively, and spanning across the cavity of the structural block; the elastic beams being mechanically coupled to receive a force applied to a force-contact bar located proximate to each of the elastic beams and positioned to be substantially over the cavity; and a piezoelectric element positioned within the cavity and mechanically coupled to the structural block, a longitudinal axis of the piezoelectric element being substantially perpendicular to a longitudinal axis of the force-contact bars; and a power-unit cylinder including the plurality of energy-harvester power-units mounted serially such that respective faces of the plurality of energy-harvester power-units are substantially parallel to each other.

Example 12: The power-harvesting device tower of Example 11, further comprising: a force-contact shaft mounted in a top plate of the power-harvesting device tower, the force-contact shaft configured to transmit a force received on the power-harvesting device tower and transmit the force to each of the plurality of energy-harvester power-units; and a bearing mounted in the top plate of the power-harvesting device tower and arranged such that the force-contact shaft traverses through the bearing.

Example 13: The energy-harvester power-unit of Example 12, wherein the piezoelectric element is configured to convert a compressive load transferred from the transmitted force received by the energy-harvester power-unit into an electrical output, the energy-harvester power-unit further comprising an electrical circuit to boost the electrical output into a power signal and save at least a portion of the power signal to an energy-storage device, the electrical circuit comprising: a full-wave bridge rectifier and a filter electrically coupled to the electrical output; and a boost converter electrically coupled to the full-wave bridge rectifier and the filter to increase a voltage level of the electrical output, the boost converter coupled to an inverter to convert a direct current (DC) output of the boost converter into an alternating current (AC) signal.

Example 14: The power-harvesting device tower of any one of Example 11 through Example 13, wherein the piezoelectric element comprises at least one layer of lead zirconate titanate (PbZr$_x$Ti$_{1-x}$O$_3$, PZT).

Example 15: A power-harvesting device, comprising: a plurality of energy-harvester power-units, each of the plurality of energy-harvester power-units including: a structural block having a first face and an opposing second face that is substantially parallel to the first face, the structural block having a cavity formed therethrough from the first face to the second face; a first elastic beam and a second elastic beam mechanically coupled substantially parallel to each of the first face and the second face, respectively, and spanning across the cavity of the structural block; the elastic beams being mechanically coupled to receive a force applied to a force-contact bar located proximate to each of the elastic beams and positioned to be substantially over the cavity; and a piezoelectric element positioned within the cavity and mechanically coupled to the structural block, a longitudinal axis of the piezoelectric element being substantially perpendicular to a longitudinal axis of the force-contact bars; and a plurality of power-unit cylinder each including each including a separate plurality of the energy-harvester power-units mounted serially such that respective faces of the plurality of energy-harvester power-units are substantially parallel to each other in respective ones of the plurality of power-unit cylinders; each of the plurality of power-unit cylinders arranged in parallel to one another.

Example 16: The power-harvesting device of Example 15, wherein each of the plurality of power-unit cylinders further comprises: a force-contact shaft mounted in a top plate of the power-harvesting device tower, the force-contact shaft configured to transmit a force received on the power-harvesting device tower and transmit the force to each of the plurality of energy-harvester power-unit; and a bearing mounted in the top plate of power-harvesting device tower and arranged such that the force, contact shaft traverses through the bearing.

Example 17: The power-harvesting device of either Example 15 or Example 16, wherein the plurality of power-unit cylinders is mounted within a structural case with a top cover, the structural case and the top cover being configured to be mounted under or within at least one type of substrate including substrates comprising a vehicular substrate and a pedestrian substrate.

Example 18: The power-harvesting device of any one of Example 15 through Example 17, wherein the piezoelectric element comprises at least one layer of lead zirconate titanate (PbZr$_x$Ti$_{1-x}$O$_3$, PZT).

Example 19: The power-harvesting device of any one of Example 15 through Example 18, wherein the piezoelectric element is configured to convert a compressive load transferred along a longitudinal axis of the piezoelectric element from a transmitted force received by the power-harvesting device into an electrical output.

Example 20: The power-harvesting device of any one of Example 15 through Example 19, further comprising an electrical circuit to boost the electrical output into a power signal and save at least a portion of the power signal to an energy-storage device, the electrical circuit comprising: a full-wave bridge rectifier and a filter coupled to the electrical output; and a boost converter to the full-wave bridge rectifier and the filter to increase a voltage level of the electrical output, the boost converter coupled to an inverter to convert a direct current (DC) output of the boost converter into an alternating current (AC) signal.

The various drawings, materials, material choices, dimensions, and so on are provided so that a skilled artisan may more readily understand the inventive concepts described herein. However, upon reading and understanding the disclosure provided herein, the skilled artisan will recognize that a variety of other drawings, materials, material choices, dimensions, and so on may be utilized with the disclosed subject matter. Therefore, the drawings, materials, material choices, dimensions, and so on should not be seen as limiting the disclosed subject matter in any away but, rather, simply providing specific exemplary embodiments under which the disclosed subject matter may be practiced.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter described herein.

In some embodiments, various ones of the hardware components may be implemented mechanically, electronically, or any suitable combination thereof as may be appropriate. Although not shown explicitly, a person of ordinary skill in the art will understand how to connect an output from various ones of the energy harvester mechanisms to produce DC- or AC-based power. For example, a hardware component may include dedicated circuitry or logic that is permanently configured to perform certain operations. For example, a hardware component may include a special-purpose processor, such as a field programmable gate array (FPGA) or an application-specific integrated circuit (ASIC) as needed for various types of power output. A hardware component may also include programmable logic or circuitry that is temporarily configured by software to perform certain operations. For example, a hardware component may include software encompassed within a general-purpose processor or other programmable processor. It will be appreciated that the decision to implement a hardware component mechanically, in dedicated and permanently configured circuitry, or in temporarily configured circuitry (e.g., configured by software) may be driven by cost and time considerations.

Accordingly, the phrase "hardware component" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented component" refers to a hardware component. Considering embodiments in which hardware component are temporarily configured (e.g., programmed), each of the hardware components need not be configured or instantiated at any one instance in time. For example, where a hardware component comprises a general-purpose processor configured by software to become a special-purpose processor, the general-purpose processor may be configured as respectively different special-purpose processors (e.g., comprising different hardware components) at different times. Software may accordingly configure a processor, for example, to constitute a particular hardware-based component at one instance of time and to constitute a different hardware component at a different instance of time.

Hardware components can provide information to, and receive information from, other hardware components. Accordingly, the described hardware components may be regarded as being communicatively coupled. Where multiple hardware components exist contemporaneously, communications may be achieved through signal transmission (e.g., over appropriate circuits and buses) between or among two or more of the hardware components. In embodiments in which multiple hardware components are configured or instantiated at different times, communications between such hardware components may be achieved, for example, through the storage and retrieval of information in memory structures to which the multiple hardware components have access. For example, one hardware component may perform an operation (e.g., a conversion of DC power to AC power) and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information).

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations.

Although various embodiments are discussed separately, these separate embodiments are not intended to be considered as independent techniques or designs. As indicated above, each of the various portions may be inter-related and each may be used separately or in combination with other power harvester devices and materials discussed herein. For example, although various embodiments of methods, operations, and processes have been described, these methods, operations, and processes may be used either separately or in various combinations.

Consequently, many modifications and variations can be made, as will be apparent to a person of ordinary skill in the art upon reading and understanding the disclosure provided herein. Functionally equivalent materials, methods, and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

REFERENCES

[1] Toprak, A. and O. Tigli, "Piezoelectric energy harvesting: State-of-the-art and challenges," *Applied Physics Reviews*, 1:3, 2014, 031104.

[2] Roundy, S., P. K. Wright and J. Rabaey, "A study of low level vibrations as a power source for wireless sensor nodes," *Computer Communications*, 26, 2003, 1131-1144.

[3] Priya, S. and D. J. Inman, *Energy Harvesting Technologies*, Springer, New York, 2009.

[4] Anton, S. R. and H. A. Sodano, "A review of power harvesting using piezoelectric materials (2003-2006)," *Smart Materials and Structures*, 16:R1, 2007.

[5] Tang, X. and L. Zuo, "ASME paper," *Proceedings of the ASME International Mechanical Engineering Congress and Exposition*, 2009, 885-896.

[6] Shenck, N. S. and J. A. Paradiso, "Energy scavenging with shoe-mounted piezoelectrics," *Micro IEEE*, 21:3, 2001, 30.

[7] Roundy, S. and P. K. Wright, "A piezoelectric vibration based generator for wireless electronics," *Smart Materials and Structures*, 13, 2004, 1131.

[8] Xu, T.-B., E. J. Siochi, J. H. Kang, L. Zuo, W. Zhou, X. Tang and X. Jiang, "Energy harvesting using a PZT ceramic multilayer stack," *Smart Materials and Structures*, 22:6, 2013, 065015.

[9] Kim, H.-W., A. Batra, S. Priya, K. Uchino, D. Markley, R. E. Newnham and H. F. Hofmann, "Energy harvesting using a piezoelectric 'cymbal' transducer in dynamic environment," *Japanese Journal of Applied Physics, Part 1*, 43:9A, 2004, 6178-6183.

[10] Uchino, K. and T. Ishii, "Energy Flow Analysis in Piezoelectric Energy Harvesting Systems," *Ferroelectrics*, 400:1, 2010, 305-320.

Priya, S., "Advances in energy harvesting using low profile piezoelectric transducers," *Journal of Electroceramics*, 19:1, 2007, 165-184.

[12] Xu, T.-B., X. Jiang, J. Su, P. W. Rehrig and W. S. Hackenberger. U.S. Pat. No. 7,446,459—Hybrid piezoelectric energy harvesting transducer system. 2008.

[13] Xu, T.-B., X. Jiang and J. Su. U.S. Pat. No. 8,680,749—Piezoelectric multilayer-stacked hybrid actuation/transduction system. 2014.

[14] Xu, T.-B., E. J. Siochi, L. Zuo, X. Jiang and J. H. Kang. U.S. Pat. No. 9,048,759—Multistage force amplification of piezoelectric stacks. 2015.

[15] Xu, T.-B. and L. Duan, "Piezoelectric Riblet with Dual Functions of Energy Harvesting and Turbulent Boundary Layer Control," NASA Case #LAR-18404-1, 2013.

[16] News. Best Technical Development award in Energy Harvesting and Storage (November 2011): http://www.idtechex.com/energy-harvesting-and-storage-usa-11/awardwinners.asp).

[17] News. Best Technical Development within Energy Harvesting and Storage award (November 2015): http://www.energyharvestingjournal.com/articles/8718/winners-of-the-2015-idtechex-awards-on-eh-iot-and-3d-printing.

[18] News. NASA Technical webinar (https://event.webcasts.com/starthere.jsp?ei=1070992) was done on Aug. 25, 2015.

[19] DNV KEMA Energy & Sustainability. Assessment of Piezoelectric Materials for Roadway Energy Harvesting—Cost of Energy and Demonstration Roadmap—Final Project; Report to California Energy Commission. Technical Report CEC-500-2013-007, Energy Research and Development Division, 2014. 4

[20] Yazdani, A., 2018. Modern Distribution Systems with PSCAD Analysis. Taylor & Francis Group: CRC Press.

[21] Yazdani, A., Crow, M. L., "Fault Detection and Mitigation in Multilevel Converter STATCOMs,", IEEE Transactions on Industrial Electronics, June 2010.

What is claimed is:

1. An energy-harvester power-unit, comprising:
a structural block having a first face and an opposing second face that is substantially parallel to the first face, the structural block having a cavity formed therethrough, the structural block further having a plurality of openings formed therethrough from the first face to the second face, each of the plurality of openings having conically-shaped elements formed thereon on the first face and the second face of the structural block;
a first contactor arm mechanically coupled to the first face of the structural block and a second contactor arm mechanically coupled the second face of the structural block on a first end of each of the respective contactor arms, each of the contactor arms spanning over at least a portion of the cavity;
a force-contact bar mechanically coupled to each of the contactor arms at a second end of the respective contactor arm, the force-contact bars positioned to be substantially over the cavity;
a first elastic beam mechanically coupled substantially parallel to the first face and a second elastic beam mechanically coupled substantially parallel to the second face, both of the elastic beams positioned substantially over the cavity of the structural block; the elastic beams being mechanically coupled to respective ones of the contactor arms;
a piezoelectric element positioned within the cavity and mechanically coupled to the structural block, a longitudinal axis of the piezoelectric element being substantially perpendicular to a longitudinal axis of the force-contact bars; and
a pair of conically-shaped compression elements configured to be matingly coupled to each of the plurality of openings to compress the piezoelectric element.

2. The energy-harvester power-unit of claim 1, wherein the piezoelectric element comprises at least one layer of lead zirconate titanate ($PbZr_xTi_{1-x}O_s$, PZT).

3. The energy-harvester power-unit of claim 1, wherein the piezoelectric element is configured to convert a compressive load transferred along the longitudinal axis of the piezoelectric element from a transmitted force received by the energy-harvester power-unit into an electrical output.

4. The energy-harvester power-unit of claim 3, further comprising an electrical circuit to boost the electrical output into a power signal and save at least a portion of the power signal to an energy-storage device, the electrical circuit comprising:
a full-wave bridge rectifier and a filter electrically coupled to the electrical output; and
a boost converter electrically coupled to the full-wave bridge rectifier and the filter to increase a voltage level of the electrical output, the boost converter coupled to an inverter to convert a direct current (DC) output of the boost converter into an alternating current (AC) signal.

5. An energy-harvester power-unit, comprising:
a piezoelectric-element structure having a first face and an opposing second face that is substantially parallel to the first face, the piezoelectric-element structure having a cavity formed therethrough from the first face to the second face and configured to hold a piezoelectric element, the cavity being located substantially in a centermost portion of the piezoelectric-element structure, the piezoelectric-element structure further having a plurality of additional openings formed therethrough from the first face to the second face that are distal to the cavity and substantially equally-spaced proximate to a periphery of the piezoelectric-element structure, each of the plurality of additional openings having conically-shaped elements formed thereon on the first face and the second face of the piezoelectric-element structure;
a first elastic beam and a second elastic beam mechanically coupled substantially parallel to each of the first face and the second face, respectively, and spanning across the cavity of the piezoelectric-element structure; and
a pair of conically-shaped compression elements configured to be matingly coupled to each of the plurality of additional openings.

6. The energy-harvester power-unit of claim 5, further comprising a force-contact bar mechanically coupled to outer faces of each of the elastic beams.

7. The energy-harvester power-unit of claim 5, further comprising a piezoelectric element mounted within the cavity of the piezoelectric-element structure.

8. The energy-harvester power-unit of claim 7, wherein the piezoelectric element comprises at least one layer of lead zirconate titanate ($PbZr_xTi_{1-x}O_3$, PZT).

9. The energy-harvester power-unit of claim 7, wherein the piezoelectric element is configured to convert a compressive load transferred along a longitudinal axis of the piezoelectric element from a transmitted force received by the energy-harvester power-unit into an electrical output.

10. The energy-harvester power-unit of claim 9, further comprising an electrical circuit to boost the electrical output into a power signal and save at least a portion of the power signal to an energy-storage device, the electrical circuit comprising:
a full-wave bridge rectifier and a filter electrically coupled to the electrical output; and
a boost converter electrically coupled to the full-wave bridge rectifier and the filter to increase a voltage level of the electrical output, the boost converter coupled to an inverter to convert a direct current (DC) output of the boost converter into an alternating current (AC) signal.

11. A power-harvesting device tower, comprising:
a plurality of energy-harvester power-units, each of the plurality of energy-harvester power-units including:
a structural block having a first face and an opposing second face that is substantially parallel to the first face, the structural block having a cavity formed therethrough from the first face to the second face, the structural block further having a plurality of openings formed therethrough from the first face to the second face, each of the plurality of openings having conically-shaped elements formed thereon on the first face and the second face of the structural block;
a first elastic beam and a second elastic beam each mechanically coupled substantially parallel to each of the first face and the second face, respectively, and spanning across the cavity of the structural block; the elastic beams being mechanically coupled to receive a force applied to a force-contact bar located proximate to each of the elastic beams and positioned to be substantially over the cavity;
a piezoelectric element positioned within the cavity and mechanically coupled to the structural block, a longitudinal axis of the piezoelectric element being substantially perpendicular to a longitudinal axis of the force-contact bars;
a pair of conically-shaped compression elements configured to be matingly coupled to each of the plurality of openings to compress the piezoelectric element; and
a power-unit cylinder including the plurality of energy-harvester power-units mounted serially such that respective faces of the plurality of energy-harvester power-units are substantially parallel to each other.

12. The power-harvesting device tower of claim 11, further comprising:
a force-contact shaft mounted in a top plate of the power-harvesting device tower, the force-contact shaft configured to transmit a force received on the power-harvesting device tower and transmit the force to each of the plurality of energy-harvester power-units; and
a bearing mounted in the top plate of the power-harvesting device tower and arranged such that the force-contact shaft traverses through the bearing.

13. The energy-harvester power-unit of claim 12, wherein the piezoelectric element is configured to convert a compressive load transferred from the transmitted force received by the energy-harvester power-unit into an electrical output, the energy-harvester power-unit further comprising an electrical circuit to boost the electrical output into a power signal and save at least a portion of the power signal to an energy-storage device, the electrical circuit comprising:
a full-wave bridge rectifier and a filter electrically coupled to the electrical output; and
a boost converter electrically coupled to the full-wave bridge rectifier and the filter to increase a voltage level of the electrical output, the boost converter coupled to an inverter to convert a direct current (DC) output of the boost converter into an alternating current (AC) signal.

14. The power-harvesting device tower of claim 11, wherein the piezoelectric element comprises at least one layer of lead zirconate titanate ($PbZr_xTi_{1-x}O_3$, PZT).

15. A power-harvesting device comprising:
a plurality of energy-harvester power-units, each of the plurality of energy-harvester power-units including:
a structural block having a first face and an opposing second face that is substantially parallel to the first face, the structural block having a cavity formed therethrough from the first face to the second face, the structural block further having a plurality of openings formed therethrough from the first face to the second face, each of the plurality of openings having conically-shaped elements formed thereon on the first face and the second face of the structural block;
a first elastic beam and a second elastic beam mechanically coupled substantially parallel to each of the first face and the second face, respectively, and spanning across the cavity of the structural block; the elastic beams being mechanically coupled to receive a force applied to a force-contact bar located proximate to each of the elastic beams and positioned to be substantially over the cavity;
a piezoelectric element positioned within the cavity and mechanically coupled to the structural block, a longitudinal axis of the piezoelectric element being substantially perpendicular to a longitudinal axis of the force-contact bars;
a pair of conically-shaped compression elements configured to be matingly coupled to each of the plurality of openings to compress the piezoelectric element; and
a plurality of power-unit cylinders each including each including a separate plurality of the energy-harvester power-units mounted serially such that respective faces of the plurality of energy-harvester power-units are substantially parallel to each other in respective ones of the plurality of power-unit cylinders; each of the plurality of power-unit cylinders arranged in parallel to one another.

16. The power-harvesting device of claim 15, wherein each of the plurality of power-unit cylinders further comprises:
a force-contact shaft mounted in a top plate of the power-harvesting device tower, the force-contact shaft configured to transmit a force received on the power-harvesting device tower and transmit the force to each of the plurality of energy-harvester power-unit; and
a bearing mounted in the top plate of power-harvesting device tower and arranged such that the force, contact shaft traverses through the bearing.

17. The power-harvesting device of claim 15, wherein the plurality of power-unit cylinders is mounted within a structural case with a top cover, the structural case and the top cover being configured to be mounted under or within at least one type of substrate including substrates comprising a vehicular substrate and a pedestrian substrate.

18. The power-harvesting device of claim 15, wherein the piezoelectric element comprises at least one layer of lead zirconate titanate ($PbZr_xTi_{1-x}O_3$, PZT).

19. The power-harvesting device of claim 15, wherein the piezoelectric element is configured to convert a compressive load transferred along a longitudinal axis of the piezoelectric element from a transmitted force received by the power-harvesting device into an electrical output.

20. The power-harvesting device of claim 15, further comprising an electrical circuit to boost the electrical output into a power signal and save at least a portion of the power signal to an energy-storage device, the electrical circuit comprising:
a full-wave bridge rectifier and a filter coupled to the electrical output; and a boost converter to the full-wave bridge rectifier and the filter to increase a voltage level of the electrical output, the boost converter coupled to an inverter to convert a direct current (DC) output of the boost converter into an alternating current (AC) signal.

\* \* \* \* \*